(12) United States Patent
Jung et al.

(10) Patent No.: US 7,772,767 B2
(45) Date of Patent: Aug. 10, 2010

(54) DISPLAY DEVICE

(75) Inventors: Kwang-Chul Jung, Seongnam-si (KR); Beohm-Rock Choi, Seoul (KR); Joon-Chul Goh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 583 days.

(21) Appl. No.: 11/677,299

(22) Filed: Feb. 21, 2007

(65) Prior Publication Data

US 2007/0194706 A1 Aug. 23, 2007

(30) Foreign Application Priority Data

Feb. 23, 2006 (KR) ............... 10-2006-0017756

(51) Int. Cl.
 *H01J 63/04* (2006.01)
(52) U.S. Cl. ............................... 313/506
(58) Field of Classification Search ......... 313/498, 313/499, 500, 501, 505, 506; 315/169.1, 315/169.3; 257/344
See application file for complete search history.

(56) References Cited

U.S. PATENT DOCUMENTS

| | | | |
|---|---|---|---|
| 6,274,887 B1 * | 8/2001 | Yamazaki et al. | 257/72 |
| 6,724,011 B2 | 4/2004 | Segawa et al. | |
| 6,930,448 B2 | 8/2005 | Kim | |
| 2004/0256617 A1 * | 12/2004 | Yamada et al. | 257/59 |
| 2005/0162079 A1 * | 7/2005 | Sakamoto | 313/504 |
| 2005/0269942 A1 * | 12/2005 | Ahn et al. | 313/503 |
| 2006/0169981 A1 * | 8/2006 | Joo | 257/66 |

FOREIGN PATENT DOCUMENTS

| | | |
|---|---|---|
| JP | 2004-118013 | 4/2004 |
| JP | 2004-126439 | 4/2004 |
| JP | 2005-106993 | 4/2005 |
| JP | 2005-108528 | 4/2005 |
| KR | 1020030057018 | 7/2003 |
| KR | 1020040075757 | 8/2004 |
| KR | 1020050031945 | 4/2005 |
| KR | 1020050041076 | 5/2005 |
| KR | 1020050043284 | 5/2005 |

* cited by examiner

*Primary Examiner*—Toan Ton
*Assistant Examiner*—Hana A Sanei
(74) *Attorney, Agent, or Firm*—Cantor Colburn LLP

(57) ABSTRACT

A display device includes; first, second and third pixel electrodes, each of the first, the second and the third pixel electrodes comprising a first edge and a second edge longer than the first edge, a first, a second and a third electrode connected to the first, second and third pixel electrodes respectively, a fourth electrode opposing the first electrode with respect to a fifth electrode, a sixth electrode opposing the second electrode with respect to a seventh electrode, and an eighth electrode opposing the third electrode with respect to a ninth electrode, wherein each of the first, fourth and fifth electrodes include a first portion disposed between the first and second pixel electrode and a second portion disposed outside of a space between the first and second pixel electrode, and the second, the sixth and the seventh electrodes are disposed outside of a space between the second and third pixel electrode.

17 Claims, 11 Drawing Sheets

DISPLAY DEVICE

This application claims priority to Korean Patent Application No. 10-2006-0017756, filed on Feb. 23, 2006, and all the benefits accruing therefrom under 35 U.S.C. §119, the contents of which in its entirety are herein incorporated by reference.

BACKGROUND OF THE INVENTION (a) Field of the Invention

The present invention relates to a display device, and more particularly, to an organic light emitting diode display.

(b) Description of the Related Art

Recently, lightweight and thin monitors and televisions are increasing in popularity, and liquid crystal displays ("LCDs") which are relatively light and thin are being substituted for conventional cathode ray tubes ("CRTs").

However, since the LCD is a passive light emitting device, a light source, such as a backlight or reflected sunlight, is required. LCDs also have many problems including slow response speed, a relatively small viewing angle, as well as other problems.

Recently, an organic light emitting diode ("OLED") display is receiving increased attention as a display device which can overcome such problems.

An OLED display includes two electrodes and an emitting layer interposed therebetween. The light emitting layer receives an electron injected from an electrode and a hole injected from the other electrode. The electron and the hole are combined in the emitting layer to generate an exciton, which radiates energy, thereby emitting light.

Since an OLED display, which is itself a light emitting display device, does not require an additional light source, it has an excellent response speed, a wide viewing angle and a high contrast ratio, as well as lower power consumption.

However, an OLED display has different light emitting efficiencies according to the color of the light emitting materials. A typical OLED may include three or more differently colored light emitting materials, each with a different light emitting efficiency; e.g., a red light emitting material with a high degree of light emitting efficiency, a green light emitting material with a medium degree of light emitting efficiency, and a blue light emitting material with a low degree of light emitting efficiency. Therefore, in order to control the emission of red, green and blue light equally, displays are designed around pixels which have the lowest light emitting efficiency, and in such displays, the aperture ratio is remarkably deteriorated.

Therefore, an OLED display device with an increased aperture ratio which ensures current driving characteristics of an OLED display is desired.

BRIEF SUMMARY OF THE INVENTION

The present invention provides a display device having advantages of ensured current driving characteristics and an increased aperture ratio.

An exemplary embodiment of the present invention provides a display device including; first, second, and third pixel electrodes, each of the first, the second, and the third pixel electrodes including a first edge and a second edge which is longer than the first edge, a first electrode connected to the first pixel electrode, a second electrode connected to the second pixel electrode, a third electrode connected to the third pixel electrode, a fourth electrode opposing the first electrode with respect to a fifth electrode, a sixth electrode opposing the second electrode with respect to a seventh electrode, an eighth electrode opposing the third electrode with respect to a ninth electrode, wherein each of the first, the fourth, and the fifth electrodes include a first portion disposed between the first pixel electrode and the second pixel electrode and a second portion disposed outside a space between the first pixel electrode and the second pixel electrode, and the second, the sixth, and the seventh electrodes are disposed outside a space between the second pixel electrode and the third pixel electrode.

In one exemplary embodiment, the second portions of the first, fourth and fifth electrodes may extend substantially parallel to the first edge of the first pixel electrode.

In one exemplary embodiment lengths of the third, the eighth, and the ninth electrodes may be shorter than lengths of the first, the fourth, and the fifth electrodes, respectively.

In one exemplary embodiment the third, eighth and ninth electrodes each may include portions extending substantially parallel to the second edge of the third pixel electrode.

In one exemplary embodiment the first portion and the second portion of each of the first, fourth and fifth electrodes may be connected to each other by a curved section.

In one exemplary embodiment an angle formed by the first portion and the second portion of the first, fourth, and fifth electrodes may be substantially 90 degrees.

In one exemplary embodiment the display device may further include; a driving voltage line disposed between the first pixel electrode and the second pixel electrode, the driving voltage line applying a driving voltage to the fourth electrode, and a data line disposed between the first pixel electrode and the second pixel electrode, wherein portions of the driving voltage line and the data line are curved toward the second pixel electrode.

In one exemplary embodiment the display device may further include a scanning line substantially perpendicular to the driving voltage line and the data line.

In one exemplary embodiment the display device may further include; an emission signal line disposed between the first pixel electrode and the second pixel electrode, the emission signal line alternately applying a driving voltage and a reference voltage to the second electrode, and a data line disposed between the first pixel electrode and the second pixel electrode, wherein portions of the emission signal line and the data line are curved toward the second pixel electrode.

In one exemplary embodiment the display device may further include a scanning line disposed substantially perpendicular to the emission data line and a pre-charge voltage line disposed substantially parallel to the scanning line.

BRIEF DESCRIPTION OF THE DRAWINGS

The above and other aspects, features and advantages of the present invention will become more apparent by describing in more detail exemplary embodiments thereof with reference to the attached drawings, in which.

DETAILED DESCRIPTION OF THE INVENTION

Figure 1:
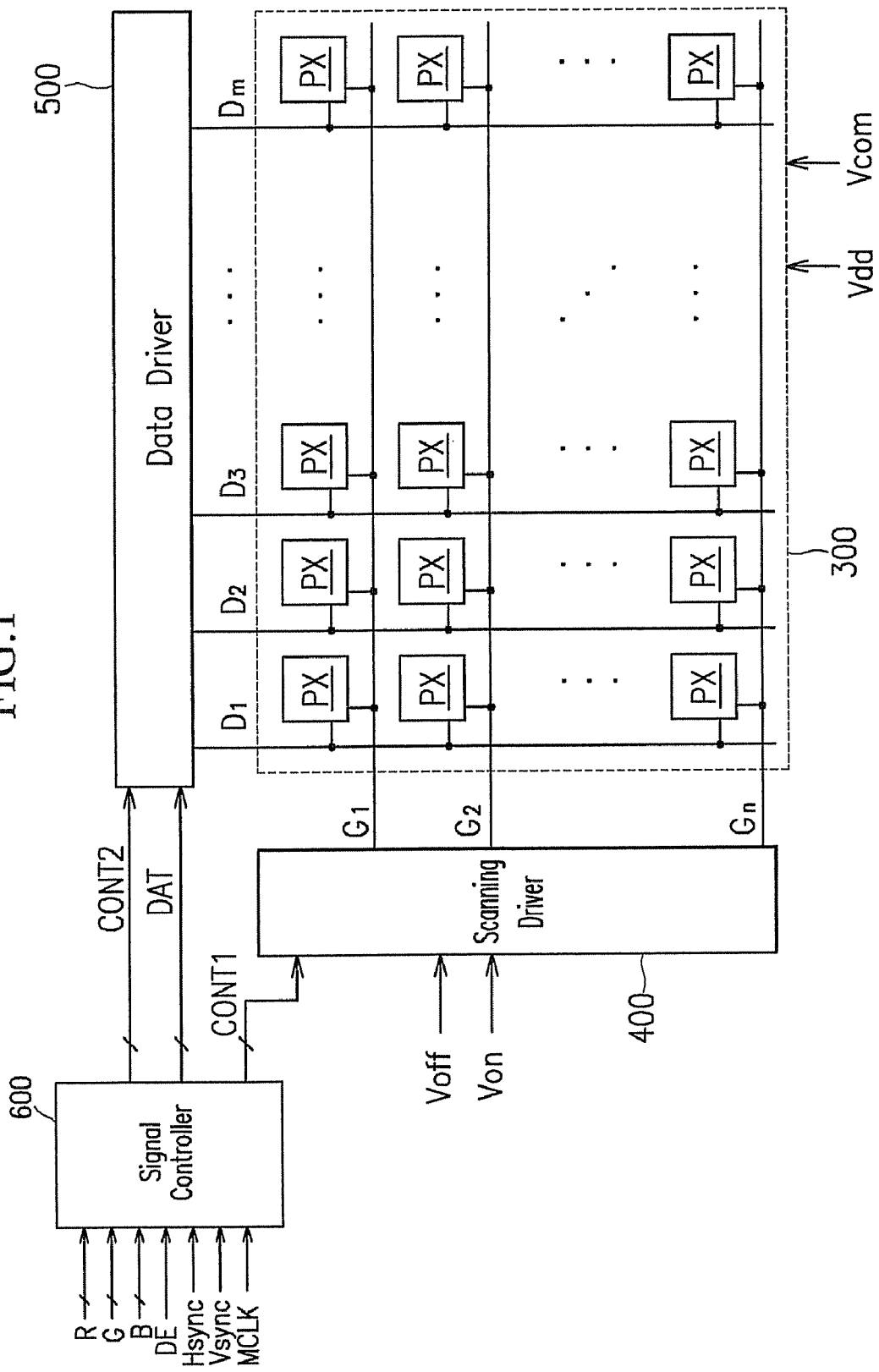
FIG. 1 is a block diagram of an exemplary embodiment of an organic light emitting diode ("OLED") display according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

An exemplary embodiment of the present invention will hereinafter be described in more detail with reference to the accompanying drawings.

Figure 2:
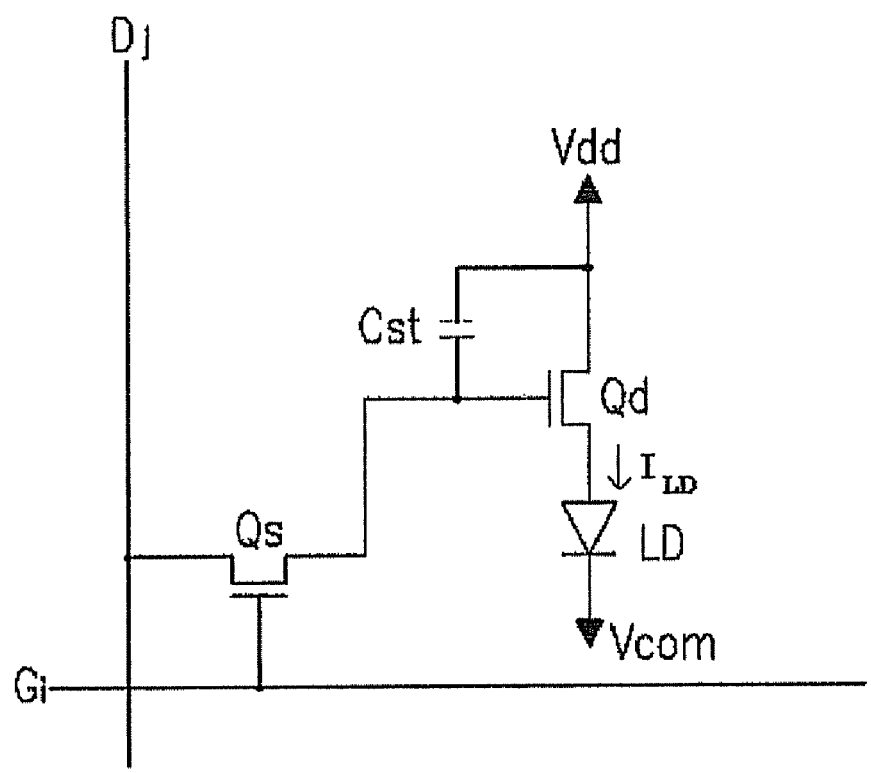
FIG. 2 is an equivalent circuit diagram of an exemplary embodiment of a pixel of an exemplary embodiment of an OLED display according to the present invention.

FIG. 1 is a block diagram of an exemplary embodiment of an organic light emitting diode ("OLED") display according to the present invention, and FIG. 2 is an equivalent circuit diagram of an exemplary embodiment of a pixel of an exemplary embodiment of an OLED display according to the present invention.

As shown in FIG. 1, an exemplary embodiment of an OLED display according to the present invention includes a display panel 300, a scanning driver 400 and a data driver 500 which are connected to the display panel 300, and a signal controller 600 controlling the above elements.

The display panel 300 includes a plurality of display signal lines $G_1$-$G_n$ and $D_1$-$D_m$, a plurality of driving voltage lines (not shown), and a plurality of pixels PX connected to the above elements and arranged substantially in a matrix shape, as seen in FIG. 1.

The display signal lines $G_1$-$G_n$ and $D_1$-$D_m$ include a plurality of scanning lines $G_1$-$G_n$ for transmitting scanning signals and a plurality of data lines $D_1$-$D_m$ for transmitting data voltages. The scanning lines $G_1$-$G_n$ extend substantially in a row direction and are separated from each other and substantially parallel to each other. The data lines $D_1$-$D_m$ extend substantially in a column direction and are separated from each other and substantially parallel to each other.

The driving voltage lines (not shown) transmits a driving voltage Vdd to each of the pixels PX.

As shown in FIG. 2, each pixel PX, for example, the pixel connected to the scanning line $G_i$ and the data line $D_j$, includes an OLED LD, a driving transistor Qd, a capacitor Cst, and a switching transistor Qs.

In one exemplary embodiment the driving transistor Qd is a three-terminal element and has a control terminal connected to the switching transistor Qs and the capacitor Cst, an input terminal connected to a driving voltage Vdd, and an output terminal connected to the OLED LD.

In one exemplary embodiment the switching transistor Qs is also a three-terminal element and has a control terminal connected to the scanning line $G_i$, an input terminal connected to the data line $D_j$, and an output terminal connected to the capacitor Cst and the driving transistor Qd.

The capacitor Cst is connected between the switching transistor Qs and a driving voltage Vdd, and the capacitor Cst stores and preserves the data voltage applied form the switching transistor Qs for a predetermined time.

In one exemplary embodiment the OLED LD has an anode connected to the driving transistor Qd and a cathode connected to the common voltage Vcom. The OLED LD displays images by emitting light having an intensity which depends on a current $I_{LD}$ supplied from the driving transistor Qd. The current $I_{LD}$ supplied from the driving transistor Qd depends on the voltage Vgs between the control terminal and the output terminal of the driving transistor Qd.

In one exemplary embodiment the switching transistor Qs and the driving transistor Qd are n-channel field effect transistors ("FETs") including amorphous silicon or polysilicon. However, alternative exemplary embodiments include configurations wherein the transistors Qs and Qd may be p-channel FETs, and in this case, the operation, voltages and currents of the p-channel FETs are opposite to those of the n-channel FETs since the p-channel FETs and the n-channel FETs are complementary to each other.

Referring to FIG. 1 again, the scanning driver 400 is connected to the scanning lines $G_1$-$G_n$ and synthesizes a high voltage Von for turning on the switching transistors Qs and a low voltage Voff for turning off the switching transistors Qs to generate scanning signals, which are applied to the scanning lines $G_1$-$G_n$.

The data driver 500 is connected to the data lines $D_1$-$D_m$ and applies data voltages to the data lines $D_1$-$D_m$.

The signal controller 600 controls the operation of the scanning driver 400 and the data driver 500, and it modifies input signals including an input image data R, G, and B, a data enable signal, a horizontal synchronization signal Hsync, a vertical synchronization signal Vsync, and a main clock signal into output signals including scanning control signals CONT1, data control signals CONT2 and output image data DAT. The process of modifying the input signals into the output signals is described in more detail below.

In one exemplary embodiment the scanning driver 400 or the data driver 500 may be implemented as at least one driving integrated circuit ("IC") chip directly mounted on the display panel 300, or they may be mounted on a flexible printed circuit film (not shown) in a tape carrier package ("TCP") attached to the display panel 300. In an alternative exemplary embodiment, the scanning driver 400 or the data driver 500 may be integrated into the display panel 300. In yet another exemplary embodiment they may be integrated into one chip.

The signal controller 600 is supplied with input image data R, G and B and input control signals controlling the display thereof, such as the vertical synchronization signal Vsync, the horizontal synchronization signal Hsync, the main clock MCLK, and the data enable signal DE, from an external graphics controller (not shown). After compensating the input image data R, G and B and the input control signals to generate the output image data DAT and generating the scanning control signals CONT1 and the data control signals CONT2, the signal controller 600 transmits the scanning control signals CONT1 to the scanning driver 400, and the data control signals CONT2 and the output image data DAT to the data driver 500.

The scanning control signals CONT1 include a scanning start signal STV for instructing to start scanning a high voltage and at least one clock signal for controlling the output of the high voltage Von.

The data control signals CONT2 include a horizontal synchronization start signal STH for informing of start of data transmission for a pixel row, a load signal LOAD for instructing to apply the data voltages to the data lines $D_1$-$D_m$, and a data clock signal HCLK.

The data driver 500 sequentially receives the image data DAT for a row of pixels in response to the data control signals CONT2 from the signal controller 600, converts each image data DAT into a data voltage, and applies the data voltage to the corresponding data lines $D_1$-$D_m$.

The scanning driver 400 applies the scanning signals to the scanning lines $G_1$-$G_n$ in response to the scanning control signals CONT1 from the signal controller 600, thereby turning on the switching transistors Qs connected the scanning lines $G_1$-$G_n$, and accordingly, the data voltages applied to the data lines $D_1$-$D_m$ are supplied to the control terminals of the driving transistors Qd through the turned-on switching transistors Qs.

The data voltages supplied to the driving transistors Qd are stored in the capacitors Cst and persist there even after the switching transistors Qs are turned off. Each of the driving transistors Qd supplied with the data voltages is turned on and outputs current $I_{LD}$ having a magnitude depending on the data voltages. Then, this current $I_{LD}$ flows into the OLED LD, and the respective pixels PX display images.

After one horizontal period (or "1H") (equal to one period of a horizontal synchronization signal Hsync and a data enable signal DE), the data driver 500 and the scanning driver 400 repeat the same operation for the next row of pixels PX. In this way, all scanning lines $G_1$-$G_n$ are sequentially supplied with the scanning signals, thereby applying the data voltages to all pixels PX. The period in which all scanning lines $G_1$-$G_n$ are supplied with the scanning signal is called a frame. By showing multiple frames in succession the illusion of moving images may be created. The next frame starts after one frame is finished, and the same operation is repeated in the next frame.

Now, an exemplary embodiment of a display panel 300 and a structure of an OLED LD of the OLED display illustrated in FIG. 2 will be described in more detail with reference to FIG. 3 to FIG. 6.

Figure 3:
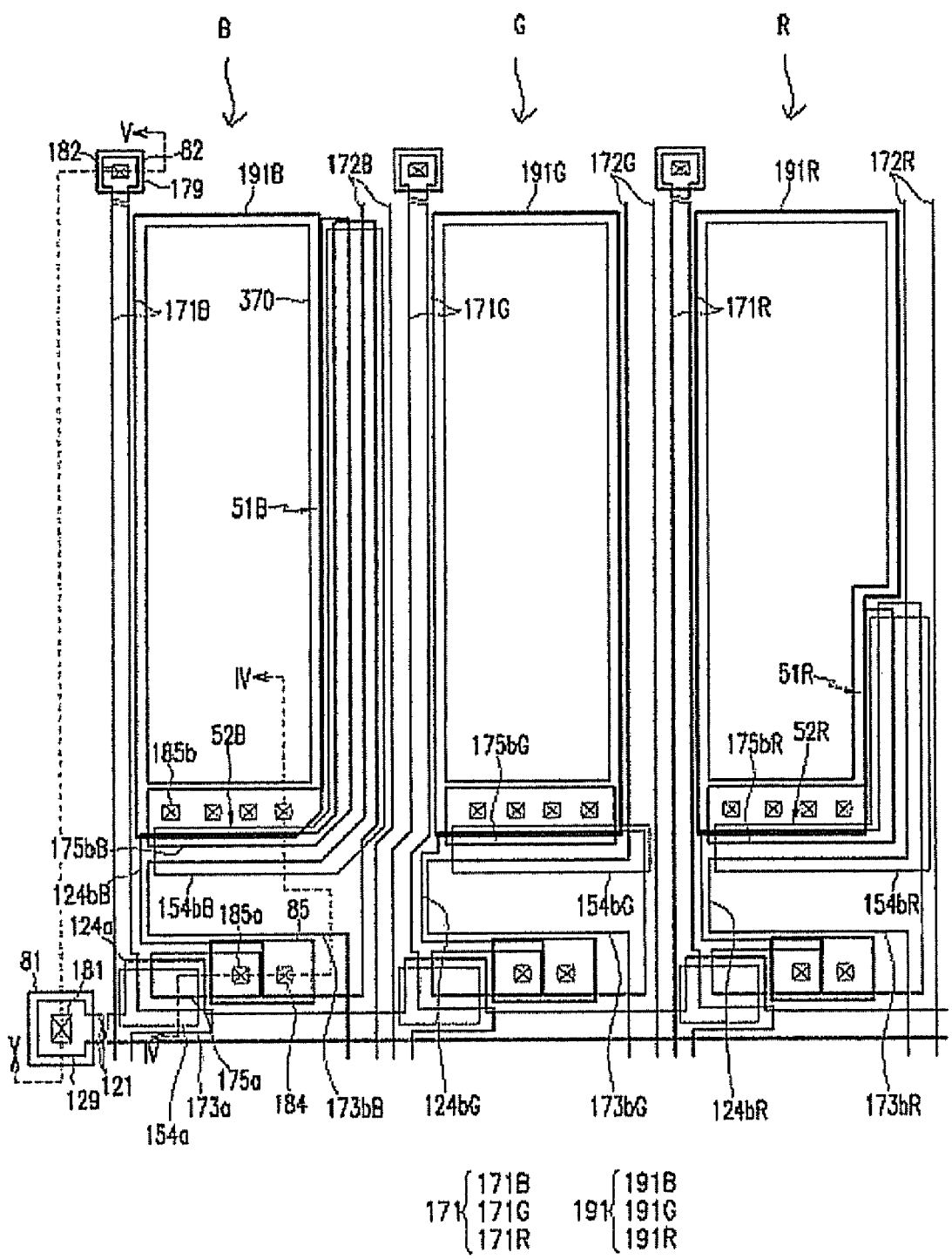
FIG. 3 a top plan layout view of an exemplary embodiment of an OLED display according to the present invention.
Figure 4:
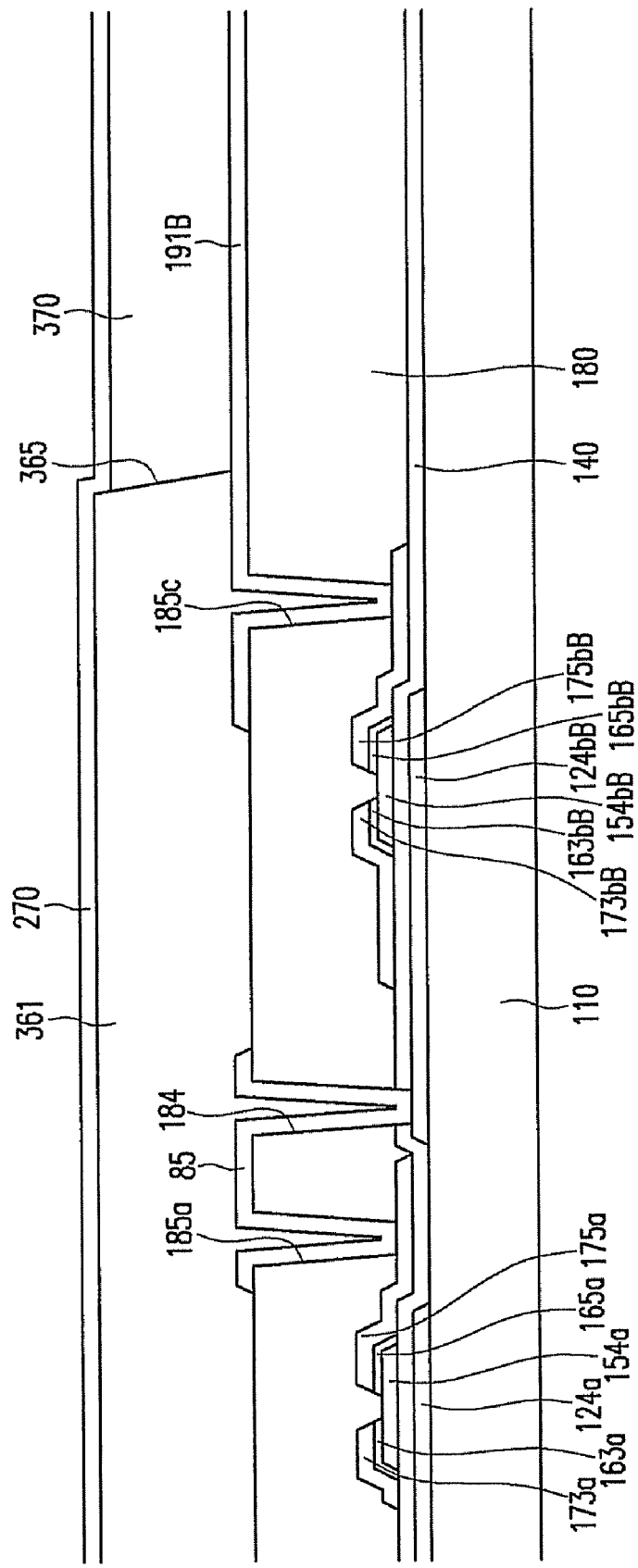
FIG. 4 and FIG. 5 are cross-sectional views of the exemplary embodiment of an OLED display shown in FIG. 3 taken along line IV-IV and line V-V, respectively.
Figure 5:
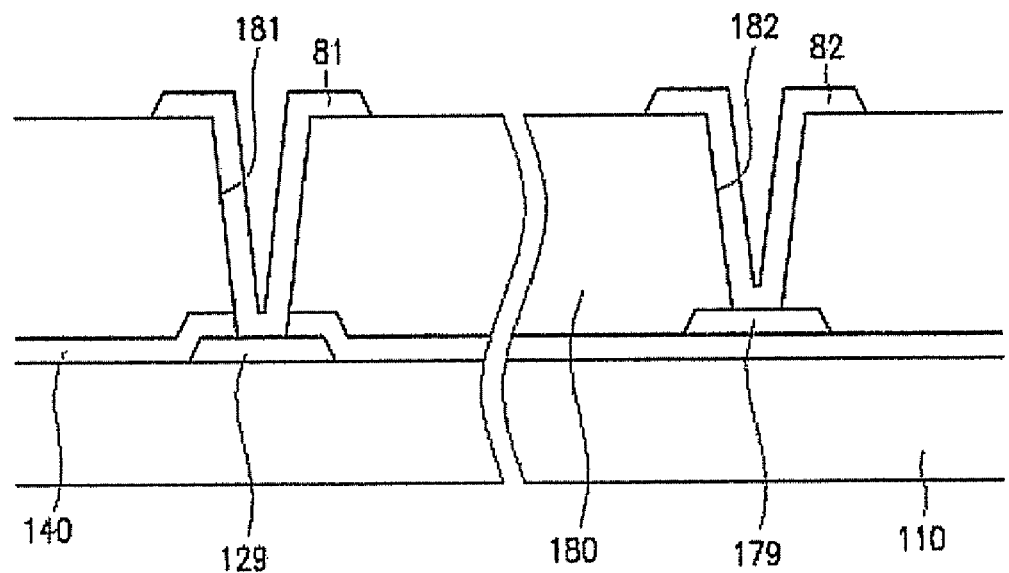
Figure 6:
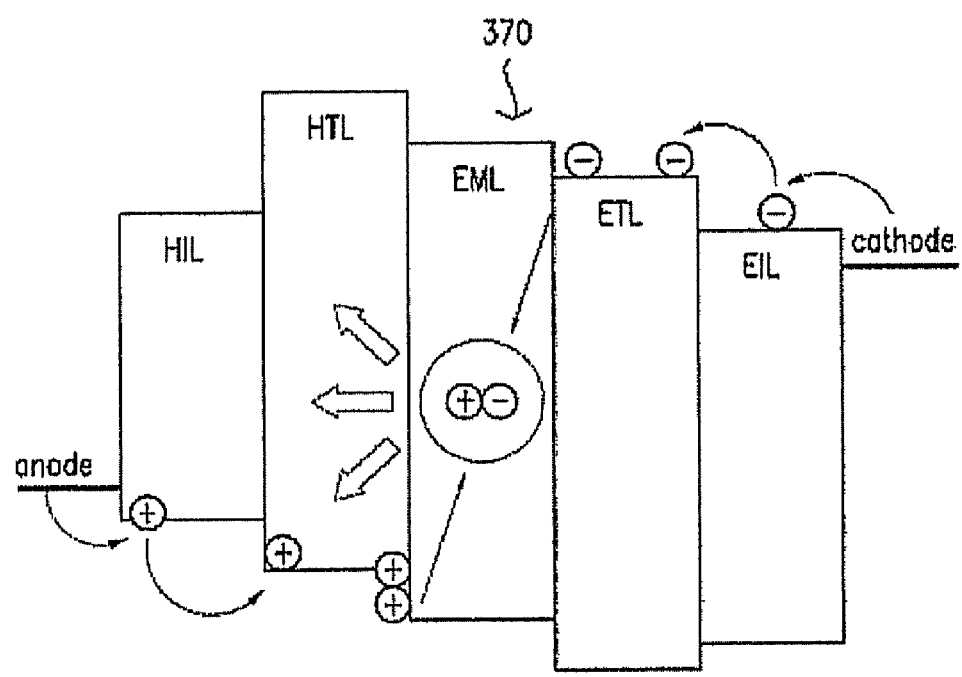
FIG. 6 is a schematic diagram of an exemplary embodiment of an OLED of the exemplary embodiment of an OLED display shown in FIG. 3.

FIG. 3 is a top plan layout view of an exemplary embodiment of an OLED display according to the present invention. FIG. 4 and FIG. 5 are cross-sectional views of the exemplary embodiment of an OLED display shown in FIG. 3 taken along line IV-IV and line V-V, respectively. FIG. 6 is a schematic diagram of an exemplary embodiment of an OLED of the exemplary embodiment of an OLED display shown in FIG. 3.

As shown in FIG. 3, an exemplary embodiment of a display device according to the present invention includes first to third pixels B, G and R, each of which has a different structure.

First, the pixel B will be described in detail.

Referring to FIG. 3 to FIG. 5, gate conductors including scanning lines 121 including first control electrodes 124a and second control electrodes 124bB are formed on an insulating substrate 110. In one exemplary embodiment the insulating substrate 110 is made of transparent glass or plastic.

The scanning lines 121 for transmitting scanning signals extend substantially in a transverse direction. Each scanning line 121 includes an end portion 129 having a large area for connection with another layer or an external driving circuit. In the exemplary embodiment wherein a scanning driving circuit (not shown) generating scanning signals is integrated onto the substrate 110, the scanning lines 121 may be extended to be directly connected to the scanning driving circuit. The first control electrode 124a extends upward from the scanning line 121.

In one exemplary embodiment the gate conductors 121 and 124bB may be made of a metal containing aluminum (Al) such as Al and Al alloys, a metal containing silver (Ag) such as Ag and Ag alloys, a metal containing copper (Cu) such as Cu and Cu alloys, a metal containing molybdenum (Mo) such as Mo and Mo alloys, a metal containing chromium (Cr), a metal containing tantalum (Ta), and a metal containing titanium (Ti). In an alternative exemplary embodiment, they may have a multi-layered structure including two conductive layers (not shown) having different physical properties. In such an alternative exemplary embodiment one of the two conductive layers is preferably made of low resistivity metal such as an Al containing metal, an Ag containing metal, or a Cu containing metal for reducing signal delay or voltage drop. The other conductive layer is preferably made of a material such as Mo containing metal, Cr, Ti, and Ta, which has good physical, chemical, and electrical contact characteristics with other materials such as indium tin oxide ("ITO") or indium zinc oxide ("IZO"). Exemplary embodiments of the alternative multi-layered structure include a lower Cr layer and an upper Al (alloy) layer and a lower Al (alloy) layer and an upper Mo (alloy) layer. However, the gate conductors 121 and 124bB may be made of many various metals or conductors and are not limited to the ones listed above.

In one exemplary embodiment the lateral sides of the gate conductors 121 and 124bB are inclined relative to a surface of the substrate 110. In one exemplary embodiment the inclination angle thereof ranges from about 30 degrees to about 80 degrees.

A gate insulating layer 140 exemplary embodiments of which may be made of silicon nitride ("SiNx") or silicon oxide ("SiOx") is formed on the gate conductors 121 and 124bB.

First and second semiconductor islands 154a and 154bB exemplary embodiments of which may be made of hydrogenated amorphous silicon ("a-Si") or polysilicon are formed on the gate insulating layer 140. The first and the second semiconductors 154a and 154bB are disposed on the first and second control electrodes 124a and 124bB, respectively.

A plurality of pairs of first ohmic contacts 163a and 165a and a plurality of pairs of second ohmic contacts 163bB and 165bB are formed on the first and the second semiconductor islands 154a and 154bB, respectively. The ohmic contacts 163a, 165a, 163bB and 165bB are island-shaped and exemplary embodiments of which may be made of n+ hydrogenated a-Si heavily doped with an n-type impurity such as phosphorus (P) or silicide. The ohmic contacts are disposed in pairs on the first and the second semiconductors 154a and 154bB.

A plurality of data conductors including data lines 171B, driving voltage lines 172B, first output electrodes 175a, and second output electrodes 175bB are formed on the ohmic contacts 163a, 165a, 163bB and 165bB and the gate insulating layer 140.

The data lines 171B for transmitting data signals extend substantially in the longitudinal direction and intersect the scanning lines 121. Each data line 171B includes a plurality of first input electrodes 173a branched out toward the first control electrode 124a and an end portion 179 having a large area for connection with another layer or an external driving circuit. The first input electrode 173a partially overlaps the first semiconductor island 154a. In the exemplary embodiment wherein a data driving circuit (not shown) is integrated on the substrate 110, the data lines 171B may be extended to be directly connected to the data driving circuit.

The first output electrode 175a is separated from the data line 171B and opposes the first input electrode 173a with respect to the first semiconductor island 154a.

The driving voltage lines 172B extend substantially in the longitudinal direction and intersect the scanning lines 121 and include second input electrodes 173bB, each of which opposes the second output electrode 175bB with respect to the second semiconductor island 154bB.

The second output electrode 175bB is separated from the driving voltage line 172B and opposes the second input electrode 173bB with respect to the second semiconductor island 154bB.

Exemplary embodiments of the data conductors 171B, 172B, 175a and 175bB are made of a refractory metal such as Mo, Cr, Ta, and Ti or an alloy thereof. Also, in an alternative exemplary embodiment the data line 171 and the drain electrode 175 may have a multi-layered structure including a refractory metal layer (not shown) and a conductive layer (not shown) having low resistivity. An exemplary embodiment of the multi-layered structure includes double layers of a lower Cr or Mo (alloy) layer and an upper Al (alloy) layer and triple layers of a lower Mo (alloy) layer, an intermediate Al (alloy) layer, and an upper Mo (alloy) layer. However, the data conductors 171B, 172B, 175a and 175bB may be made of many various metals or conductive materials and the present invention is not limited to those listed above.

In one exemplary embodiment, similar to the gate conductors 121 and 124bB, the lateral sides of the data conductors 171B, 172B, 175a and 175bB are inclined relative to a surface of the substrate 110. In one exemplary embodiment the inclination angles thereof are in a range of about 30 degrees to about 80 degrees.

The ohmic contacts 163a, 165a, 163bB and 165bB are interposed between the underlying semiconductors 154a and 154bB and the overlying data conductors 171B, 172B, 175a and 175bB and reduce the contact resistance therebetween. The semiconductors 154a and 154bB include exposed portions which are not covered with the data conductors 171B, 172B, 175a and 175bB such as portions located between the input electrodes 173a and 173bB and the output electrodes 175a and 175bB.

A passivation layer 180 is formed on the data conductors 171B, 172B, 175a and 175bB and the exposed portions of the semiconductors 154a and 154bB. In one exemplary embodiment the passivation layer 180 is made of an inorganic insulator or an organic insulator and the surface thereof is flat. Exemplary embodiments of the inorganic insulator include silicon nitride and silicon oxide. The organic insulator may have photosensitivity. In one exemplary embodiment the dielectric constant of the organic insulator is lower than about 4.0. In an alternative exemplary embodiment the passivation layer 180 may have a double-layered structure including a lower inorganic layer and an upper organic layer in order to not harm the exposed portions of the semiconductors 154a and 154bB and to make the most of the excellent insulating characteristics of an organic layer.

The passivation layer 180 has a plurality of contact holes 182, 185a, and 185b respectively exposing the end portions 179 of the data lines 171B and the first and the second output electrodes 175a and 175bB. The passivation layer 180 and the gate insulating layer 140 have a plurality of contact holes 181 and 184 respectively exposing the end portions 129 of the scanning lines 121 and the second input electrodes 124bB.

A plurality of pixel electrodes 191B, a plurality of connecting members 85, and a plurality of contact assistants 81 and 82 are formed on the passivation layer 180. Exemplary embodiments of the plurality of pixel electrodes 191B, the plurality of connecting members 85, and the plurality of contact assistants 81 and 82 may be made of a transparent conductor such as ITO or IZO, or a reflective metal such as Al, Ag, Cr, or an alloy thereof.

The pixel electrode 191B is physically and electrically connected to the second output electrode 175bB through the contact hole 185b.

The connecting member 85 connects the second control electrode 124bB and the first output electrode 175a through the contact holes 184 and 185a.

The contact assistants 81 and 82 are connected to the end portion 129 of the scanning line 121 and the end portion 179 of the data line 171B through the contact holes 181 and 182, respectively. The contact assistants 81 and 82 supplement the adhesive property of the end portions 129 and 179 of the scanning lines 121 and the data lines 171B to exterior devices, and protect them from corrosion, abrasion, and other damage.

A partition 361 is formed on the passivation layer 180. The partition 361 encloses the pixel electrode 191B to define an opening 365 on the pixel electrode 191B. The partition 361 functions like a bank around the opening 365. Exemplary embodiments of the partition 365 are made of an organic or inorganic insulating material. Also, exemplary embodiments of the partition 361 may be made of a photosensitive material containing black pigment, in such an exemplary embodiment, the partition 361 functions as a light blocking member and the formation thereof is simplified.

Organic light emitting members 370 are disposed in the openings 365 on the pixel electrodes 191B defined by the partition 361. In one exemplary embodiment each of the organic light emitting members 370 is made of an organic material uniquely emitting one of a primary color of light, exemplary embodiments of the primary colors include red, green, and blue. In the present exemplary embodiment, the first pixel B displays blue, the second pixel G displays green, and the third pixel R displays red.

As shown in FIG. 6, the organic light emitting member 370 has a multi-layered structure including an emitting layer EML and auxiliary layers for improving the efficiency of light emission of the emitting layer EML. The auxiliary layers include an electron transport layer ETL and a hole transport layer HTL for improving the balance of electrons and holes in the emitting layer EML. The auxiliary layers may also include an electron injecting layer EIL and a hole injecting layer HIL for improving the injection of electrons and holes into the transport layers. In an alternative exemplary embodiment the auxiliary layers may be omitted.

A common electrode 270 is formed on the organic light emitting member 370. The common electrode 270 is supplied with a common voltage Vcom. In one exemplary embodiment the common electrode 270 is made of a reflective metal such as calcium (Ca), barium (Ba), magnesium (Mg), aluminum (Al), and silver (Ag) or a transparent conductive material such as ITO or IZO.

A combination of opaque pixel electrodes 191B and a transparent common electrode 270 is employed in a top emission type OLED display which emits light toward the common electrode 270, and a combination of transparent pixel electrodes 191B and a opaque common electrode 270 is employed to a bottom emission type OLED display which emits light toward the insulating substrate 110.

In the above-described OLED display, a first control electrode 124a connected to a scanning line 121, a first input electrode 173a connected to a data line 171B, and a first output electrode 175a, along with a semiconductor island 154a, form a switching thin film transistor ("TFT") Qs, and a second control electrode 124bB connected to the first output electrode 175a, a second input electrode 173bB connected to a driving voltage line 172B, and a second output electrode 175bB, along with a second semiconductor island 154bB, form a driving TFT Qd.

Here, a channel of the switching TFT Qs is formed in the first semiconductor island 154a disposed between the first input electrode 173a and the first output electrode 175a, and a channel of the driving TFT Qd is formed in the second semiconductor island 154bB disposed between the second input electrode 173bB and the second output electrode 175bB.

Meanwhile, the driving voltage line 172B extends substantially along the space between the first pixel and the second pixel B and G, and a portion of the driving voltage line 172B protrudes to the left to form a portion of the second input electrode 173bB. Each of the second control electrode 124bB, the second semiconductor island 154bB, and the second output electrode 175bB includes a first portion 51B opposing and extending substantially along the long edge of the pixel electrode 191B and a second portion 52B opposing and extending substantially along the short edge of the pixel electrode 191B. That is, the first and the second portions 51B and 52B are curved at substantially a right angle to one another. Here, the curved corners of the second control electrode 124bB, the second semiconductor island 154bB, and the second output electrode 175bB, and the corner of the pixel electrode 191B opposing them are chamfered. The driving voltage line 172B is curved toward the first pixel B at the beginning position of the first portions 51B of the second control electrode 124bB, the second semiconductor island 154bB, and the second output electrode 175bB.

Now, the structure of the second pixel G will be described in more detail.

As shown in FIG. 3, in the second pixel G gate conductors including scanning lines 121 including first control electrodes 124a and second control electrodes 124bG are formed on an insulating substrate 110, exemplary embodiments of which may be made of transparent glass or plastic. A gate insulating layer 140 is formed on the gate conductors 121 and 124bG. First and second semiconductor islands 154a and 154bG are formed on the gate insulating layer 140. A plurality of pairs of first and second ohmic contacts 163a, 165a, 163bG and 165bG are formed on the semiconductor islands 154a and 154bG, respectively. A plurality of data conductors including data lines 171G, driving voltage lines 172G, first output electrodes 175a, and second output electrodes 175bG are formed on the ohmic contacts 163a, 165a, 163bG and 165bG and the gate insulating layer 140. Each data line 171G includes a plurality of first input electrodes 173a branched out toward the first control electrode 124a, and each driving voltage line 172G includes a plurality of second input electrodes 173bG branched out toward the second control electrode 124bG. A passivation layer 180 is formed on the data conductors 171G, 172G, 175a and 175bG and the exposed portions of the semiconductors 154a and 154bG. The passivation layer 180 has a plurality of contact holes 181, 182, 184, 185a, and 185b, and pixel electrodes 191G are formed on the passivation layer 180. A partition 361 and an organic light emitting member 370 are formed on the passivation layer 180. A common electrode 270 is formed on the organic light emitting member 370.

However, unlike the first pixel B, in the second pixel G, the second control electrode 124bG, the second semiconductor island 154bG, and the second output electrode 175bG are not formed around the long edge of the pixel electrode 191G, but instead are formed around the short edge of the pixel electrode 191G. That is, there is no driving transistor formed in the space between the second pixel G and the third pixel R. Consequently, the space between the second and the third pixels G and R can be reduced compared to the space between the first and the second pixels B and G. The area of the pixel electrodes 191G of the first and the second pixels B and G can then be increased by as much area as the reduced space, thereby increasing the aperture ratio of the first and second pixels.

Now, the structure of disposition of the third pixel R will be described in more detail.

As shown in FIG. 3, in the third pixel R, gate conductors including scanning lines 121 including first control electrodes 124a and second control electrodes 124bR are formed on an insulating substrate 110, an exemplary embodiment of which is made of transparent glass or plastic. A gate insulating layer 140 is formed on the gate conductors 121 and 124bR. First and second semiconductor islands 154a and 154bR are formed on the gate insulating layer 140. A plurality of pairs of first and second ohmic contacts 163a, 165a, 163bR and 165bR are formed on the semiconductor islands 154a and 154bG, respectively. A plurality of data conductors including data lines 171R, driving voltage lines 172R, first output electrodes 175a, and second output electrodes 175bR are formed on the ohmic contacts 163a, 165a, 163bR and 165bR and the gate insulating layer 140. Each data line 171R includes a plurality of first input electrodes 173a branched out toward the first control electrode 124a, and each driving voltage line 172R includes a plurality of second input electrodes 173bR branched out toward the second control electrode 124bR. A passivation layer 180 is formed on the data conductors 171R, 172R, 175a and 175bR and the exposed portions of the semiconductors 154a and 154bR. The passivation layer 180 has a plurality of contact holes 181, 182, 184, 185a, and 185b, and pixel electrodes 191R are formed on the passivation layer 180. A partition 361 and an organic light emitting member 370 are formed on the passivation layer 180. A common electrode 270 is formed on the organic light emitting member 370.

Similarly to the first pixel B, the third pixel R includes first portions 51R of the second control electrode 124bR, the second semiconductor island 154bR, and the second output electrode 175bR formed substantially along the long edge of the pixel electrode 191R and second portions 52R thereof formed substantially along the short edge of the pixel electrode 191R. However, the length of first portions 51R of the third pixel R is shorter than the length of the first portions 51B of the first pixel B.

The light emitting efficiency differs in each of the pixels B, G, and R according to the color of light emitted by the organic light emitting members 370 of the respective pixels B, G, and R. That is, the light emitting efficiency of an OLED LD varies according to the light emitting material, for example, the light emitting efficiency decreases in order of green, red, and blue. Hereinafter, a description follows on the premise that the light emitting efficiency of a blue light emitting material is the lowest and the light emitting efficiency becomes higher in order of red and green. However, the present invention applies to any OLED wherein light emitting efficiency is a function of the color of the light emitting material.

Additional current is required by each pixel in proportion to the decrease in light emitting efficiency in comparison to the other color pixels. Therefore the channel width should be increased in order to provide the additional current necessary to emit light of the same intensity. In the exemplary embodiment in which blue pixels B, red pixels R and green pixels G are disposed to neighbor each other as in FIG. 3, a channel width of the blue pixel B having the lowest light emitting efficiency is the widest, and the channel width of the driving transistor of the red pixel R is narrower than the blue pixel B and yet is larger than the channel width of the driving transistor of the green pixel G. Accordingly, the reduction in channel width in the R and G pixels creates additional space for other components of the pixel to expand into.

The pixel electrodes of all three pixels R, G and B may be expanded to take advantage of the additional space. The additional space created by the reduced space requirements of the second control electrodes 124G and 124R, the second semiconductor islands 154bG and 154bR, and the second output electrode 175bG and 175bR may be utilized to increase the area of the pixel electrode. That is, the additional space of the red pixel R may be used for enlarging the pixel electrode 191R of the red pixel R, and the green pixel G which has even more additional space than the red pixel R due to the green pixel G's high light emitting efficiency, the space is used for enlarging the pixel electrodes 191B and 191G of both the blue pixel B and the green pixel G. Therefore, an aperture ratio of a display device can be increased by increasing the overall pixel electrode size, while properly adjusting channel widths of three pixels B, G and R having different light emitting efficiencies from each other so that they emit a uniform amount of light.

Even though it was described above that the light emitting efficiency becomes higher in order of the green pixel G, the red pixel R, and the blue pixel B, this order may be changed according to the light emitting materials.

Now, another exemplary embodiment of an OLED display according to the present invention will be described in more detail with reference to FIG. 7 to FIG. 9.

Figure 7:
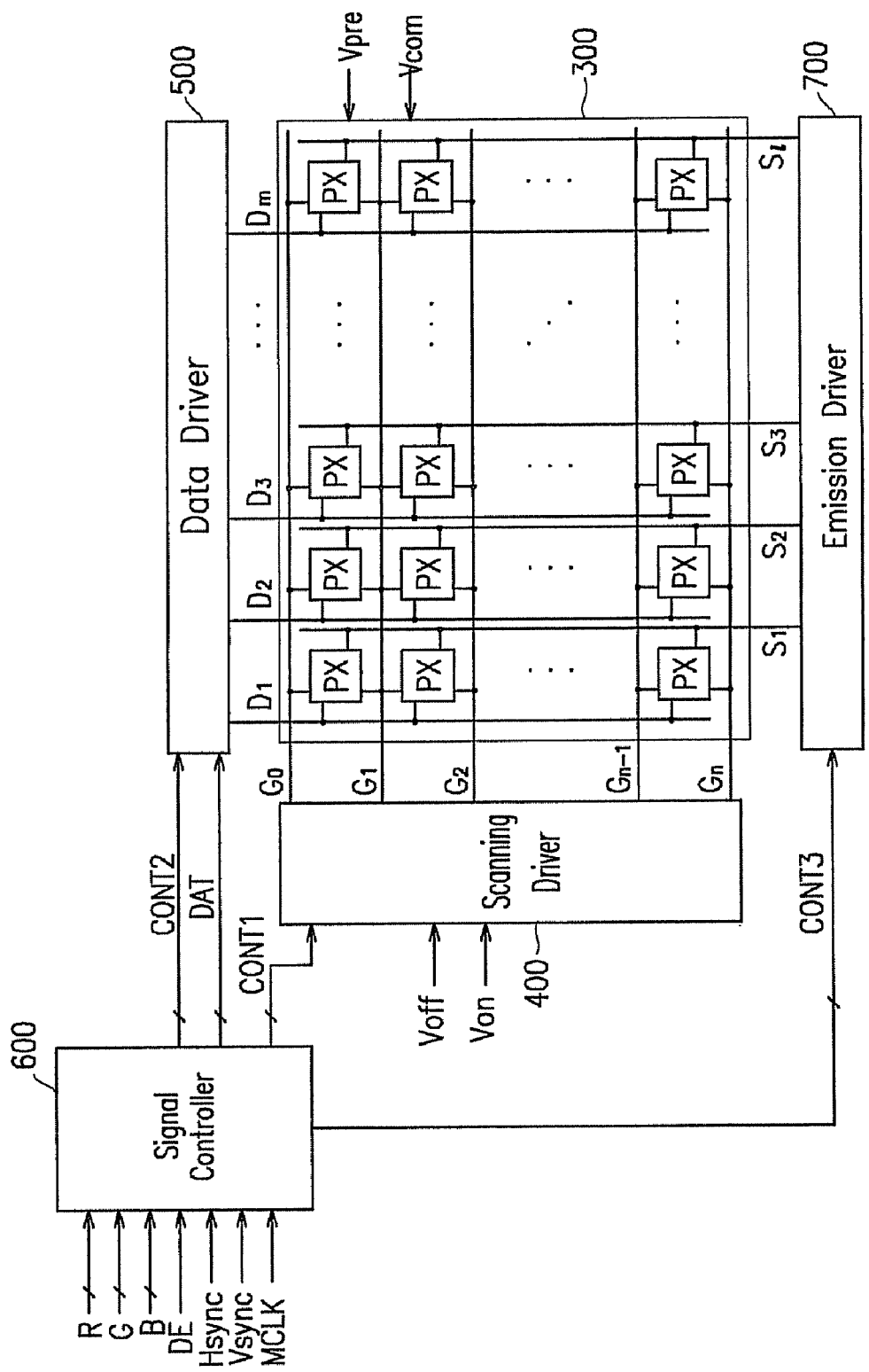
FIG. 7 is a block diagram of another exemplary embodiment of an OLED display according to the present invention.

FIG. 7 is a block diagram of another exemplary embodiment of an OLED display according to the present invention. FIG. 8 is an equivalent circuit diagram of an exemplary embodiment of a pixel of the exemplary embodiment of an OLED display shown in FIG. 7.

As shown in FIG. 7, an exemplary embodiment of an OLED display according to the present invention includes a display panel 300, a scanning driver 400 and a data driver 500 and an emission driver 700 which are connected to the display panel 300, and a signal controller 600 controlling the above elements.

The display panel 300 includes a plurality of signal lines $G_0$-$G_n$, $D_1$-$D_m$, and $S_1$-$S_n$, a plurality of voltage lines (not shown), and a plurality of pixels PX connected to the above elements and arranged substantially in a matrix, as seen in FIG. 7.

The signal lines include a plurality of scanning lines $G_0$-$G_n$ for transmitting scanning signals $Vg_0$-$Vg_n$, a plurality of data lines $D_1$-$D_m$ for transmitting data signals Vdata, and a plurality of emission signal lines $S_1$-$S_l$ for transmitting light emitting signals $Vs_1$-$Vs_n$. The scanning lines $G_0$-$G_n$ extend substantially in a row direction and are substantially parallel to each other, and the data lines $D_1$-$D_m$ and the emission signal lines $S_1$-$S_l$ extend substantially in a column direction and are substantially parallel to each other.

The voltage lines include pre-charge voltage lines Pi for transmitting a pre-charge voltage Vpre.

Figure 8:
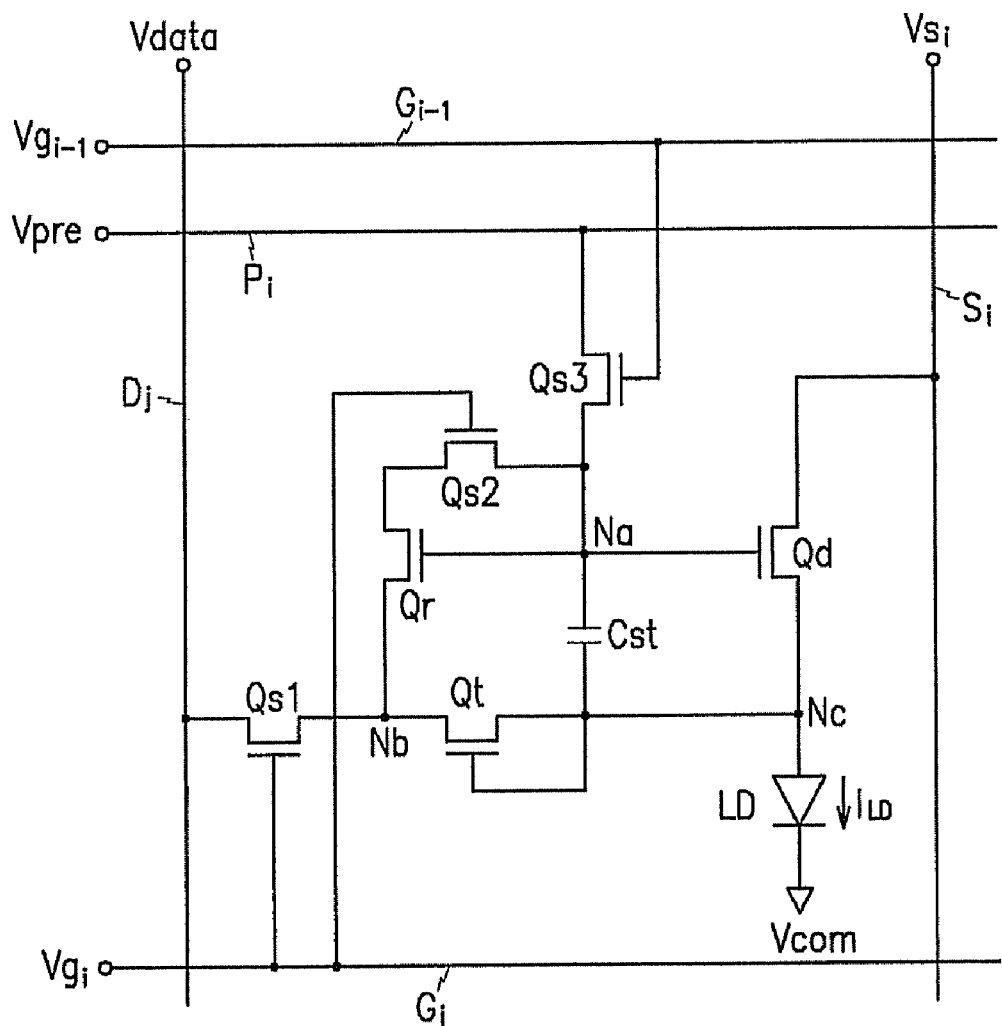
FIG. 8 is an equivalent circuit diagram of an exemplary embodiment of a pixel of the exemplary embodiment of an OLED display shown in FIG. 7.

As shown in FIG. 8, each pixel PX, for example, the pixel connected to the scanning line $G_i$ and the data line $D_j$, includes an OLED LD, a driving transistor Qd, a reference transistor Qr, a capacitor Cst, a cutoff transistor Qt, and three switching transistors Qs1, Qs2 and Qs3.

The driving transistor Qd includes a control terminal, an input terminal and an output terminal, where the control terminal is connected to a node Na. The node Na is connected with a reference transistor Qr, switching transistors Qs2 and Qs3, and a capacitor Cst. The input terminal of the driving transistor Qd is connected to a light emitting signal $V_{si}$. The output terminal of the driving transistor Qd is connected to a node Nc connected with an OLED LD.

The reference transistor Qr also includes a control terminal, an input terminal, and an output terminal, where the control terminal is connected to a node Na, and the input terminal is connected to a switching transistor Qs2, and the output terminal is connected to a node Nb, wherein the node Nb is connected with a switching transistor Qs1 and a cutoff transistor Qt.

The capacitor Cst is connected between the node Na and the node Nc.

The cutoff transistor Qt is connected between the node Nb and the node Nc, and its control terminal (gate) is connected to the node Nc. However, alternative exemplary embodiments include configurations wherein the control terminal of the cutoff transistor Qt is connected to the node Nb.

The anode and the cathode of the OLED LD are connected to the node Nc and a common voltage Vcom, respectively. The OLED LD displays an image by emitting light having an intensity depending on the current $I_{LD}$ supplied by the driving transistor Qd. The current $I_{LD}$ depends on the voltage Vgs between the control terminal and the output terminal of the driving transistor Qd.

The switching transistor Qs1 is connected to a scanning line $G_i$, a data voltage Vdata, and the node Nb, and it operates responding to a scanning signal $Vg_i$.

The switching transistor Qs2 is connected to a scanning line $G_i$, the input terminal of the reference transistor Qr, and the node Na, and it operates responding to a scanning signal $Vg_i$.

The switching transistor Qs3 is connected to a previous scanning line $G_{i-1}$, a pre-charge voltage Vpre, and the node Na, and it operates responding to a previous scanning signal $Vg_{i-1}$.

In one exemplary embodiment these transistors Qd, Qr, Qs1-Qs3, and Qt are n-channel field effect transistors ("FETs") including amorphous silicon or polysilicon. However, alternative exemplary embodiments include configurations wherein the transistors Qd, Qr, Qs1-Qs3, and Qt may be p-channel FETs, and in this exemplary embodiment, since the p-channel FETs and the n-channel FETs are complementary to each other, the operations, voltages, and currents of the p-channel FETs are opposite to those of the n-channel FETs.

Referring to FIG. 7 again, the scanning driver 400 is connected to the scanning lines $G_0$-$G_n$ of the display panel 300 and applies scanning signals $Vg_i$ consisting of a high voltage Von for turning on the switching transistors Qs1-Qs3 and a low voltage Voff for turning off the switching transistors Qs1-Qs3 to the scanning lines $G_0$-$G_n$.

The data driver 500 is connected to the data lines $D_1$-$D_m$ of the display panel 300 and applies data voltages Vdata representing image signals to the data lines $D_1$-$D_m$.

The emission driver 700 is connected to the emission signal lines $S_1$-$S_l$ of the display panel 300 and applies light emitting signals $Vs_i$ consisting of a driving voltage Vdd and a reference voltage Vref to the emission signal lines $S_1$-$S_n$.

The scanning driver 400, the data driver 500, or the emission driver 700 may be implemented in the form of a plurality of driving integrated circuit ("IC") chips directly mounted on the display panel 300, or they may be mounted on a flexible printed circuit film (not shown) in a tape carrier package ("TCP") which is attached to the display panel 300. In an alternative exemplary embodiment, the scanning driver 400, the data driver 500, or the emission driver 700 may be integrated into the display panel 300 along with the signal lines $G_0$-$G_n$, $D_1$-$D_m$, and $S_1$-$S_n$ and the transistors Qd, Qr, and Qs1-Qs3.

The signal controller 600 controls the scanning driver 400, the data driver 500 and the emission driver 700.

The operation of the exemplary embodiment of the OLED display will be described in more detail with reference to FIG. 9.

Figure 9:
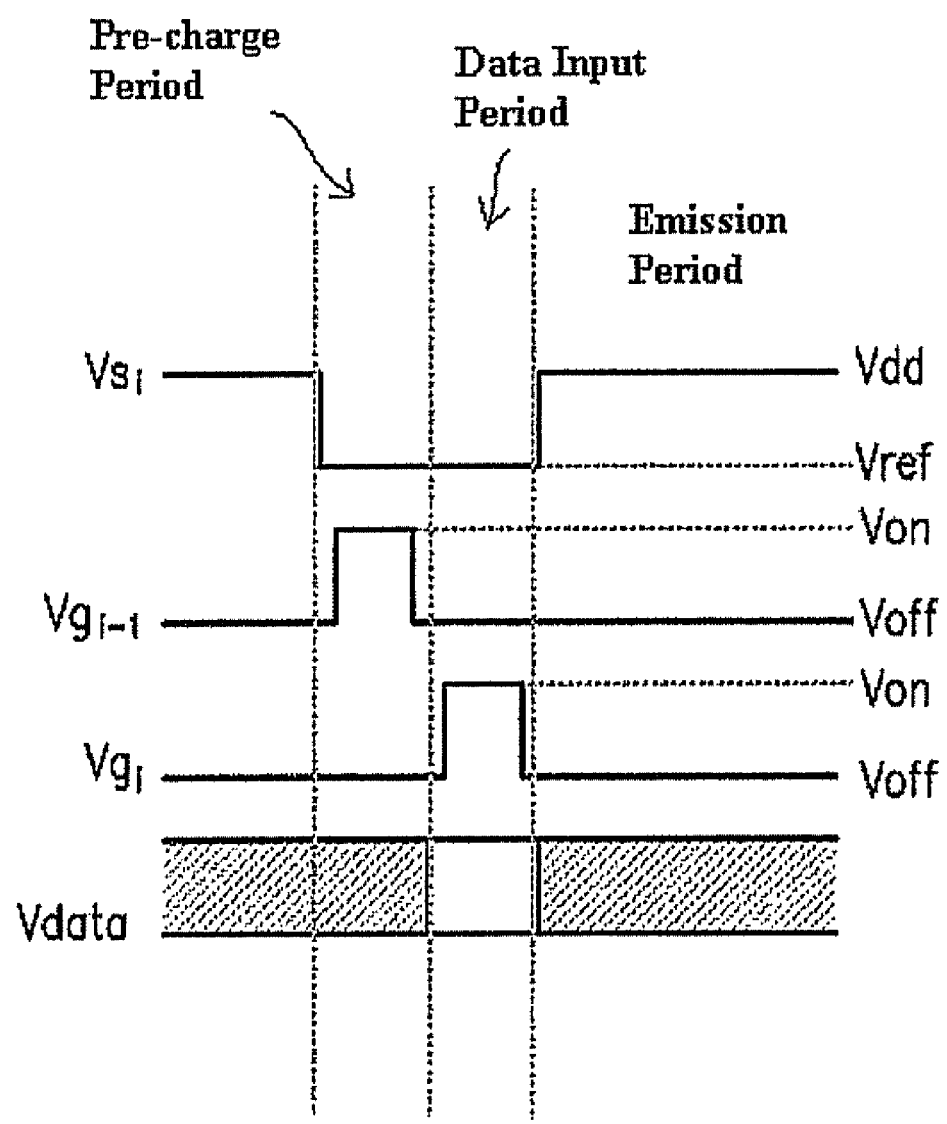
FIG. 9 is a waveform diagram of driving signals of the exemplary embodiment of a pixel of the exemplary embodiment of an OLED display of FIG. 8.

FIG. 9 is an exemplary waveform diagram of driving signals of the exemplary embodiment of a pixel of the exemplary embodiment of the OLED display of FIG. 8.

The signal controller 600 is supplied with input image signals R, G and B and input control signals controlling the display thereof, such as a vertical synchronization signal Vsync, a horizontal synchronization signal Hsync, a main clock MCLK, and a data enable signal DE, from an external graphics controller (not shown). On the basis of the input control signals and the input image signals R, G and B, the signal controller 600 processes the input image signals R, G, and B into processed image signals DAT for the display panel 300 and generates scanning control signals CONT1, data control signals CONT2, and light emitting control signals CONT3, and then, it transmits the scanning control signals CONT1 to the scanning driver 400 and transmits the processed image signals DAT and the data control signals CONT2 to the data driver 500 and transmits the light emitting control signals CONT3 to the emission driver 700.

The scanning control signals CONT1 include a scanning start signal STV for instructing to start scanning a high voltage and at least one clock signal for controlling the output of the high voltage Von. The scanning control signals CONT1 may further include an output enable signal OE for defining the duration of the high voltage Von.

The data control signals CONT2 include a horizontal synchronization start signal STH for informing of the start of data transmission for a pixel row, a load signal LOAD for instructing to apply the data voltages to the data lines $D_1$-$D_m$, and a data clock signal HCLK.

To simplify the discussion of the present exemplary embodiment, a specific pixel row will be focused on and described, for example, the i-th row.

First, during what will be referred to as a pre-charging period, the emission driver 700 converts the light emitting signal $Vs_i$ into the reference voltage Vref in response to the light emitting control signals CONT3 from the signal controller 600, and the scanning driver 400 converts the scanning signal $Vg_{i-1}$ for the previous scanning line, that is, the (i−1)-th scanning line $G_{i-1}$ into the high voltage Von in response to the scanning control signals CONT1 while the data lines $D_1$-$D_m$ are transmitting data voltages Vdata for the previous pixel row, that is, the (i−1)-th pixel row. Then, the switching transistor Qs3 in the i-th pixel row connected to the previous scanning line $G_{i-1}$ is turned on. Here, since the scanning signal $Vg_i$ which the i-th scanning line $G_i$ transmits is the low voltage Voff, other switching transistors Qs1 and Qs2 in the i-th pixel row are in a turned-off state.

Then, a pre-charge voltage Vpre is applied to the node Na through the switching transistor Qs3, and the voltage Vpre is maintained by the capacitor Cst. The pre-charge voltage Vpre is set to a sufficiently higher value than the data voltages Vdata and the reference voltage Vref. Meanwhile, the reference voltage Vref from the emission signal line Si is set lower than a threshold voltage Vtho of the OLED LD with respect to the common voltage Vcom. Accordingly, even though the driving transistor Qd is turned on during the pre-charging period so that the reference voltage Vref is applied to the node Nc, current doesn't flow through the OLED LD, which therefore doesn't emit light. Instead, the voltage difference between the two nodes Na and Nc is stored in the capacitor Cst.

Subsequently, in a period which will be referred to as a data input period, the data driver 500 receives the image data DAT for the pixels PX of i-th row in response to the data control signals CONT2 from the signal controller 600 and converts the image data DAT into analog data voltages Vdata, which are applied to the data lines $D_1$-$D_m$.

The scanning driver 400 changes the previous scanning signal $Vg_{i-1}$ from the high voltage Von into the low voltage Voff to turn off the switching transistor Qs3 before the application of the data voltages Vdata for the i-th pixel row, and it changes the scanning signal $Vg_i$ into the high voltage Von simultaneously with or within a relatively short time period after the application of the data voltages Vdata for the i-th pixel row to turn on the switching transistors Qs1 and Qs2, which begins the data input period.

During the data input period, the light emitting signal $Vs_i$ is sustained at the reference voltage Vref, and the switching transistor Qs1 applies the data voltage Vdata to the node Nb. Accordingly, during the data input period, the voltage at the node Nb is the data voltage Vdata, and the voltage at the node Nc is the reference voltage Vref due to the charge stored in the capacitor Cst.

When the data voltage Vdata is greater than the reference voltage Vref, the node Nb drains the transistor Qt, and the node Nc becomes a source thereof. Therefore, since the gate and the source are connected to each other, current flowing from the node Nb to the node Nc is relatively small.

On the contrary, when the reference voltage Vref is greater than the data voltage Vdata, the node Nb becomes a source of the transistor Qt, and the node Nc becomes a drain thereof. In this case, if the reference voltage Vref, the data voltage Vdata, and the width to length ratio ("W/L") of the transistor Qt are set so that the difference between the reference voltage Vref and the data voltage Vdata is smaller than a threshold voltage of the transistor Qt, current flowing from the node Nc to the node Nb is relatively small. Consequently, during the data input period, the current flowing between the node Nb and the node Nc is relatively small even though a voltage difference is generated between the two nodes Nb and Nc.

Also, if the W/L of the transistor Qt is adequately set in consideration of the discharge speed of the voltage at the node Nb after the switching transistors Qs1 and Qs2 are turned off, the current flowing between the nodes Nb and Nc is very small.

Meanwhile, since the pre-charge voltage Vpre is greater than the data voltage Vdata, the reference transistor Qr is turned on as the data input period starts. Therefore, charges stored in the capacitor Cst are discharged through the switching transistor Qs2, the reference transistor Qr, and the switching transistor Qs1. The discharge proceeds until the voltage difference between the control terminal and the output terminal of the reference transistor Qr is equal to a threshold voltage Vthr of the reference transistor Qr, at which point the discharge stops. Here, a voltage VA measured at the node Na converges into a voltage represented by the following equation, and the higher the pre-charge voltage Vpre is, the more quickly the voltage VA converges into the value.

$$VA = Vthr + Vdata \quad \text{(Equation 1)}$$

Here, in the exemplary embodiment wherein the reference transistor Qr is disposed close to and has substantially the same structure as the driving transistor Qd in a given pixel, a threshold voltage Vthr of the reference transistor Qr and a threshold voltage Vthd of the driving transistor Qd are substantially equal to each other. Therefore, a voltage Vgs between the control terminal and the output terminal of the driving transistor Qd is equal to a voltage shown in the following equation, and the voltage Vgs is stored in the capacitor Cst.

$$Vgs = Vthd + Vdata - Vref \quad \text{(Equation 2)}$$

Then, in a period which will hereinafter be referred to as an emission period, the scanning driver 400 converts the scanning signal $Vg_i$ into the low voltage Voff in response to the scanning control signals CONT1 to turn off the switching transistors Qs1 and Qs2. Then, the node Na is in a floating state, and the node Nb is disconnected from the data voltage Vdata. Then, charges stored in a parasitic capacitor at the node Nb are discharged to the node Nc through a resistance R, so that a voltage of the node Nb is equal to a voltage of the node Nc. Here, the time taken while a voltage of the node Nb reaches a voltage of the node Nc is determined by a time constant T, which is obtained by multiplying the parasitic capacitance at the node Nb by the resistance R. In the present exemplary embodiment the time constant T is equal to the time during which a voltage of the node Nb reaches about 63.2% of a voltage of the node Nc.

When a predetermined time elapses after the scanning signal $Vg_i$ is converted into the low voltage Voff, the emission driver 700 converts the light emitting signal $Vs_i$ into the driving voltage Vdd in response to the light emitting control signals CONT3, which begins the emission period. The driving voltage Vdd is set to a relatively high value, so that the driving transistor Qd can operate in a saturated region. Accordingly, the driving transistor Qd supplies an output current $I_{LD}$ controlled by a voltage difference Vgs between the control terminal and the output terminal of the driving transistor Qd to the OLED LD through the output terminal. The OLED LD emits light having a varying intensity depending on the output current $I_{LD}$. A plurality of OLED LDs may then be used to display an image.

The voltage at the node Nc increases when a current flows, but the voltage stored in the capacitor Cst is sustained since the control terminal of the driving transistor Qd is in a floating state. The driving current $I_{LD}$ flowing through the OLED LD, as transmitted by the driving transistor Qd, during the emission period is determined irrespective of the threshold voltage Vthd of the driving transistor Qd and the threshold voltage Vtho of the OLED LD as follows.

$$\begin{aligned} I_{LD} &= 1/2 * K * (Vgs - Vthd)^2 \quad \text{(Equation 3)} \\ &= 1/2 * K * (Vthd + Vdata - Vref - Vthd)^2 \\ &= 1/2 * K * (Vdata - Vref)^2 \end{aligned}$$

Here, K is a constant according to characteristics of a TFT, that is, K=μ·Ci·W/L, where μ denotes a field effect mobility, Ci denotes a capacitance of the insulating layer, W denotes a channel width of the driving transistor Qd, and L denotes a channel length of the driving transistor Qd.

The threshold voltages Vthd and Vthr of the driving transistor Qd and the reference transistor Qr are somewhat variable due to stresses applied during an operation of the transistors Qd and Qr, this divergence in threshold voltages is more pronounced when the two transistors Qd and Qr include amorphous silicon. Since the above equations are disrupted if the threshold voltages Vthd and Vthr of the two transistors Qd and Qr become different from each other due to stress, the stresses involved and how to diminish their effects requires further description.

The main stress given to the driving transistor Qd and the reference transistor Qr is a voltage difference Vgs between the control terminal and the output terminal of the two transistors Qd and Qr. Since the control terminals of the driving transistor Qd and the reference transistor Qr are connected to each other, voltages of the control terminals are always equal to each other. Additionally, an output terminal voltage of the driving transistor Qd is equal to a voltage at the node Nc, and an output terminal voltage of the reference transistor Qr is equal to a voltage at the node Nb. Voltages of the node Nb and the node Nc are different from each other only while data voltages Vdata are inputted during the data input period and are the same in the pre-charge period and the data input period. If the number of the scanning lines $G_1$-$G_n$ is 1,000, the data input period is only 0.1% of one frame. Accordingly, voltages of the node Nb and the node Nc are substantially the same since the time during which the voltages of the node Nb and the node Nc are different from each other is only 0.1% of a frame. Therefore, the voltage difference between the control terminal and the output terminal applied to the reference transistor Qr is substantially the same as that of the driving transistor Qd, and accordingly, the range of variation in a threshold voltage Vthr of the reference transistor Qr can be seen as substantially the same as the range of variation of a threshold voltage Vthd of the driving transistor Qd.

Consequently, a threshold voltage Vthr of the reference transistor Qr is substantially the same as a threshold voltage Vthd of the driving transistor Qd.

Alternative exemplary embodiments include configurations wherein W/L values of the driving transistor Qd and the reference transistor Qr may be designed differently, and accordingly, threshold voltages Vthd and Vthr of the two transistors Qd and Qr may also be different from each other. Then, equation 2 and equation 3 are changed into as follows.

$$Vgs = Vthr + Vdata - Vref \quad \text{(Equation 4)}$$

$$\begin{aligned}I_{LD} &= 1/2 \times K \times (Vgs - Vthd)^2 \quad \text{(Equation 5)}\\&= 1/2 \times K \times (Vthr + Vdata - Vref - Vthd)^2\\&= 1/2 \times K \times \{Vdata - Vref(Vthr - Vthd)\}^2\end{aligned}$$

If the display panel 300 is designed so that the threshold voltage difference Vthr–Vthd between the driving transistor Qd and the reference transistor Qr is uniform over all pixels, that is, the threshold voltage difference Vthr–Vthd is a constant, all pixels display the same luminance for a given data voltage, and accordingly, there is no problem in displaying images. As described above, since variation values of threshold voltages Vthr and Vthd of the driving transistor Qd and the reference transistor Qr are equal to each other irrespective of W/L, the difference Vthr–Vthd between the threshold voltages Vthr and Vthd of the driving transistor Qd and the reference transistor Qr is uniform even if the threshold voltages Vthr and Vthd themselves vary.

Therefore, if characteristics of each transistor Qd and Qr are uniform over the entire display panel 300, variation in a threshold voltage can be compensated for. Consequently, the size of the reference transistor Qr can be made smaller than that of the driving transistor Qd to simplify the process and increase the amount of pixel area dedicated to the pixel electrode and the light emitting layer, thereby increasing the aperture ratio.

On the contrary, as described above, in the exemplary embodiment wherein the driving transistor Qd and the reference transistor Qr have the same threshold voltage, variation in a threshold voltage Vthd of the driving transistor Qd can be compensated for even if characteristics of the transistors Qd and Qr are different for each pixel.

The emission period proceeds until the pre-charging period of the next frame begins again for the pixels PX in the i-th row, and the operations in the respective periods described above are repeated equally for the pixels PX in the next row. In this manner, the period control is performed sequentially for all the scanning lines $G_0$-$G_n$ and the emission signal lines $S_1$-$S_j$, so that an image associated with all the pixels PX can be displayed. Here, the scanning line $G_0$ and the scanning signal $Vg_0$ are used for displaying an image for the pixels PX in the first row.

The length of each period may be modified as necessary and the beginning and ending of each period may vary slightly from that shown in FIG. 9.

In this way, according to the present exemplary embodiment, deterioration of image quality can be prevented by compensating for variations in threshold voltages Vthd and Vtho of a driving transistor Qd and an OLED LD.

In another exemplary embodiment, the driving voltage Vdd may be used as a pre-charge voltage to compensate for variations in the threshold voltages Vthd and Vtho, and also in this exemplary embodiment, the driving voltage Vdd should be sufficiently high for stable compensation of those variations. However, if the driving voltage Vdd is too high, heat emission of the OLED display is increased, and therefore, elements in the OLED display are easily deteriorated. However, by using an additional pre-charge voltage Vpre separately from a driving voltage Vdd as in the previously described exemplary embodiment of the present invention, the pre-charge voltage Vpre can be sufficiently high while the driving voltage Vdd is relatively low. Therefore, heat emission of an OLED display can be decreased and deterioration of the OLED due to the heat can be prevented.

Now, an exemplary embodiment of a display panel of the exemplary embodiment of an OLED display shown in FIG. 7 and FIG. 8 will be described in detail with reference to FIG. 10 and FIG. 11.

Figure 10:
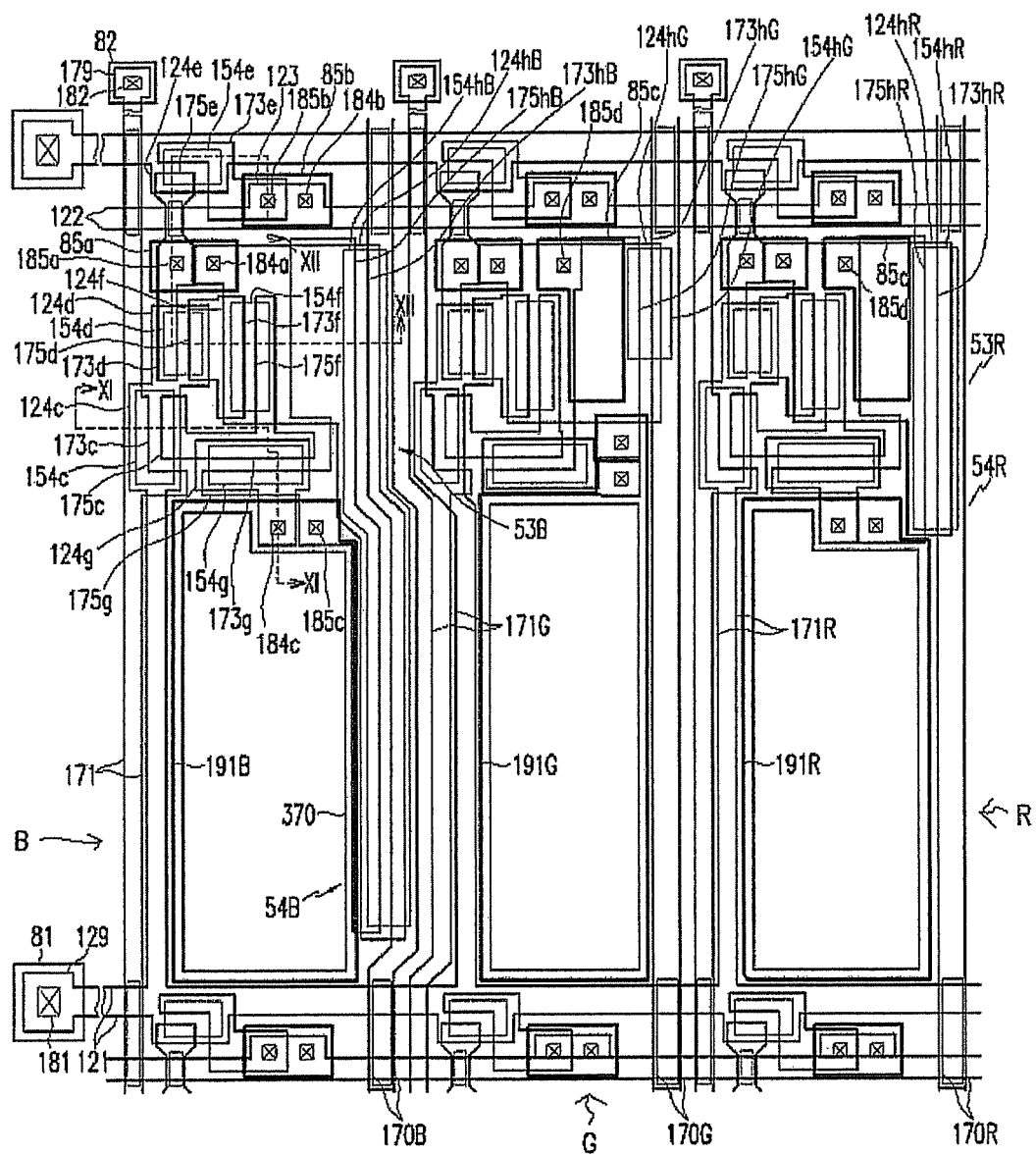
FIG. 10 is a top plan layout view of another exemplary embodiment of an OLED display according to the present invention.

FIG. 10 is a top plan layout view of another exemplary embodiment of a display panel of an OLED display according to the present invention. FIG. 11 and FIG. 12 are cross-sectional views of the OLED display shown in FIG. 10 taken along line XI-XI and line XII-XII, respectively.

As shown in FIG. 10, an exemplary embodiment of a display device according to the present invention includes first to third pixels B, G and R, each of which has a different structure.

First, the first pixel B will be described in detail.

Gate conductors including scanning lines 121 including first and second projections 124 and 124e, pre-charge voltage lines 122 including third projections 123, and first electrode members 126 are formed on an insulating substrate 110 preferably made of transparent glass or plastic.

The scanning lines 121 for transmitting scanning signals extend substantially in a transverse direction. Each scanning line 121 includes an end portion 129 having a large area for connection with another layer or an external driving circuit. The first projection 124 extends upward from the scanning line 121 and includes third and fourth control electrodes 124c and 124d (first and second control electrodes are not included in this exemplary embodiment, but are discussed in more detail with reference to the exemplary embodiment shown in FIG. 3). The second projection 124e extends downward from the scanning line 121, and the second projection 124e of the previous scanning line 121 becomes a fifth control electrode 124e of the corresponding pixel. In the exemplary embodiment wherein a scanning driving circuit (not shown) generating scanning signals is integrated onto the substrate 110, the scanning lines 121 may be extended to be directly connected to the scanning driving circuit.

The gate conductors include a sixth control electrode 124f separated from the scanning line 121.

The first electrode member 126 is separated from the scanning line 121 and includes seventh and eighth control electrodes 124g and 124hB.

The pre-charge voltage line 122 for transmitting a pre-charge voltage Vpre extends substantially parallel to the scanning line 121.

Figure 11:
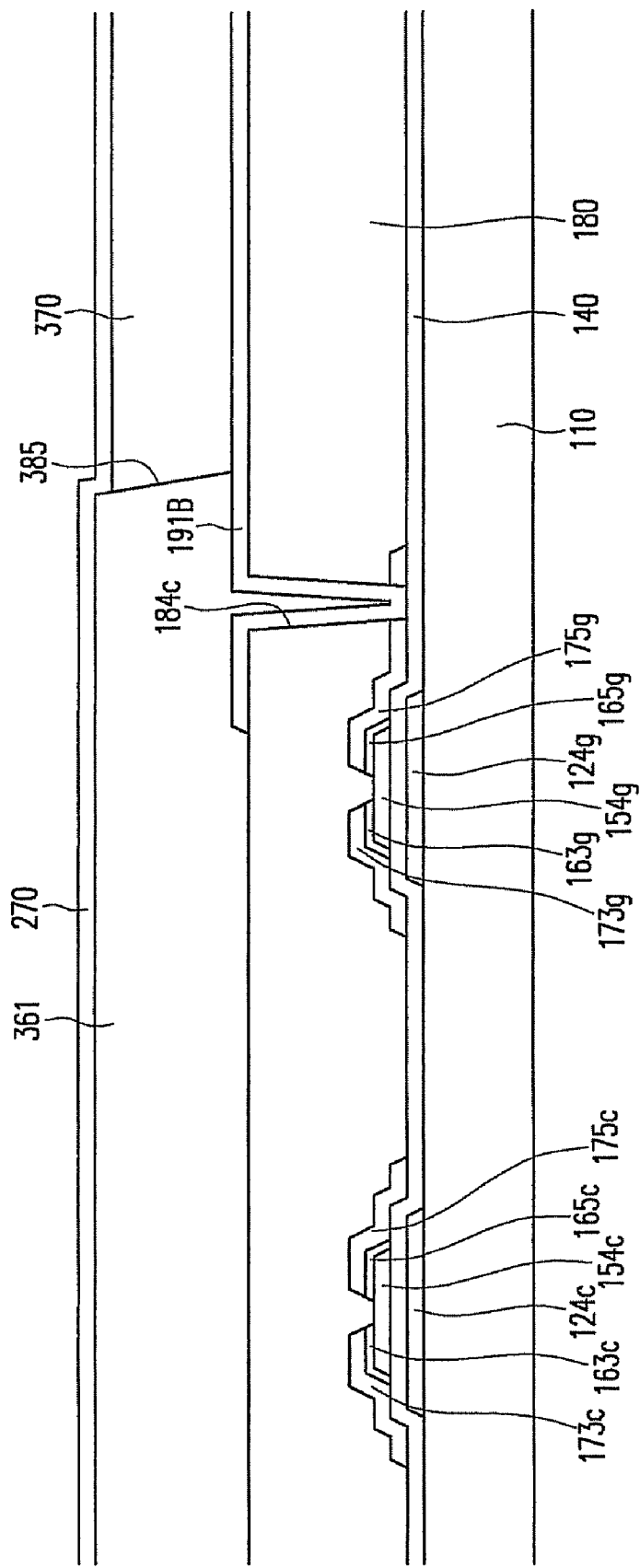
FIG. 11 and FIG. 12 are cross-sectional views of the OLED display shown in FIG. 10 taken along line XI-XI and line XII-XII, respectively.
Figure 12:
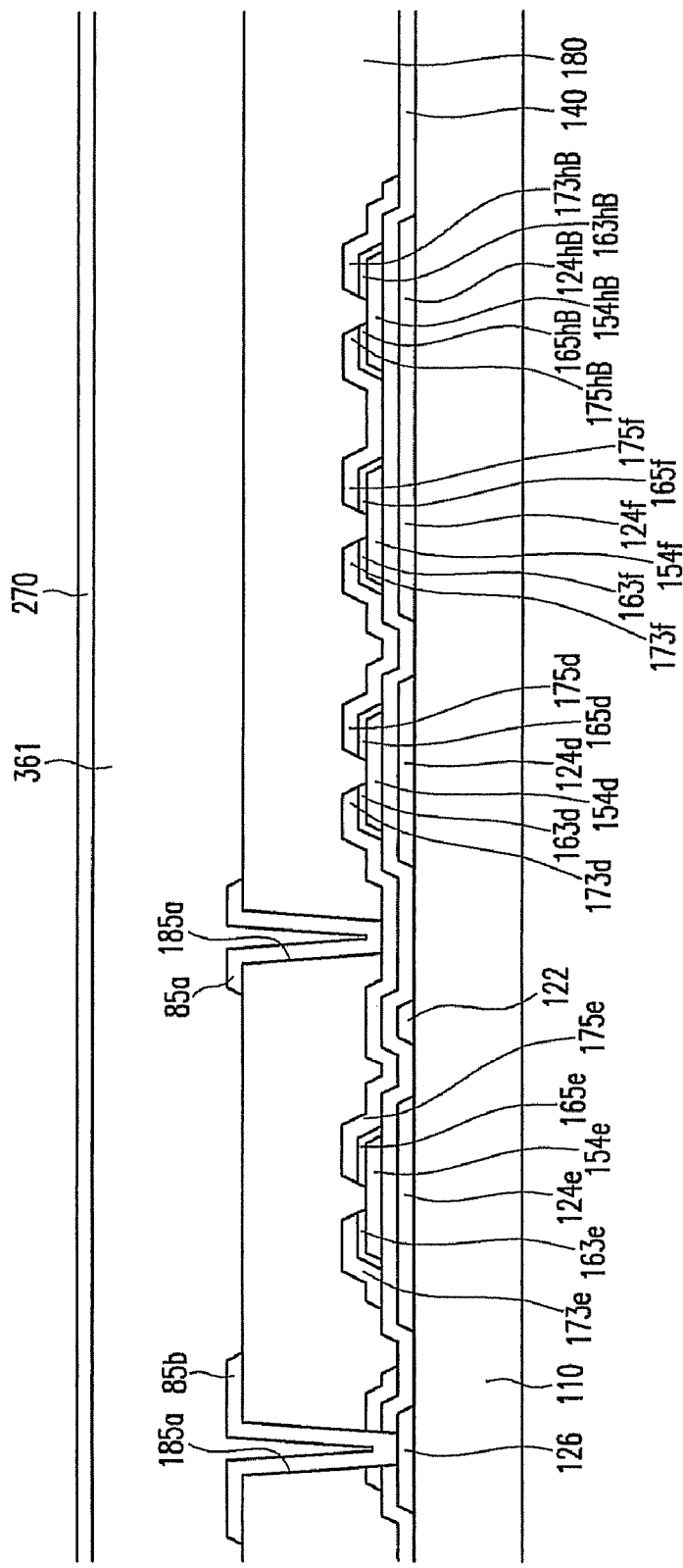

As seen in FIGS. 11 and 12, a gate insulating layer 140 is formed on the gate conductors 121, 122, 124f and 126.

Third to eighth semiconductor islands 154c, 154d, 154e, 154f, 154g, and 154hB are formed on the gate insulating layer 140 (first and second semiconductor islands are not included in this exemplary embodiment, but are discussed in detail with reference to the exemplary embodiment shown in FIG. 3). The third to the eighth semiconductor islands 154c-h are disposed on the third to the eighth control electrodes 124c-hB, respectively.

A plurality of pairs of third ohmic contacts 163c and 165c, a plurality of pairs of fourth ohmic contacts 163d and 165d, a plurality of pairs of fifth ohmic contacts 163e and 165e, a plurality of pairs of sixth ohmic contacts 163f and 165f, a plurality of pairs of seventh ohmic contacts (not shown), and a plurality of pairs of eighth ohmic contacts 163hB and 165hB are formed on the semiconductor islands 154c-hB, respectively (first and second ohmic contacts are not included in this exemplary embodiment, but are discussed in detail with reference to the exemplary embodiment shown in FIG. 3). The third to the eighth ohmic contacts 163c, 165c, 163d, 165d, 163e, 165e, 163f, 165f, 163hB and 165hB are disposed in pairs on the third to the eighth semiconductor islands 154c-hB.

A plurality of data conductors including emission signal lines 170B, data lines 171B, second electrode members 174, third electrode members 176, fourth electrode members 177 and fifth electrode members 178 are formed on the ohmic contacts 163c, 165c, 163d, 165d, 163e, 165e, 163f, 165f, 163hB and 165hB and on the gate insulating layer 140.

The data lines 171B for transmitting data signals extend substantially in the longitudinal direction and intersect the scanning lines 121. Each data line 171B includes a plurality of third input electrodes 173c branched out toward the third control electrode 124c and an end portion 179 having a large area for connection with another layer or an external driving circuit. The third input electrode 173c partially overlaps the third semiconductor island 154c. In the exemplary embodiment wherein a data driving circuit (not shown) is integrated on the substrate 110, the data lines 171B may be extended to be directly connected to the data driving circuit.

The second electrode member 174 is separated from the data line 171B and includes a third output electrode 175c opposing the third input electrode 173c with respect to the third semiconductor island 154c.

The data conductors include a fifth input electrode 173e overlapping the fifth semiconductor island 154e.

The third electrode member 176 is formed to traverse the pre-charge voltage line 122, one end of which includes a fourth input electrode 173d, while the other end includes a fifth output electrode 175e opposing the fifth input electrode 173e with respect to the fifth semiconductor island 154e.

The fourth electrode member 177 is separated from the data line 171B, one end of which includes a fourth output electrode 175d opposing the fourth input electrode 173d with respect to the fourth semiconductor island 154d, while the other end includes a sixth input electrode 173f overlapping the sixth semiconductor island 154f.

A sixth output electrode 175f opposes the sixth input electrode 173f with respect to the sixth semiconductor island 154f, and a seventh input electrode 173g overlaps the seventh semiconductor island 154g, and the sixth output electrode 175f and the seventh input electrode 173g, along with the third output electrode 175c, form a second electrode member 174.

The fifth electrode member 178 includes a seventh output electrode 175g opposing the seventh input electrode 173g with respect to the seventh semiconductor island 154g.

The emission signal line 170B extends substantially in the longitudinal direction and intersects the scanning line 121 and includes an eighth input electrode 173hB overlapping the eighth semiconductor island 154hB. The emission signal line 170B applies a light emitting signal $Vs_i$ and a reference voltage Vref alternately to the eighth input electrode 173hB.

An eighth output electrode 175hB opposes the eighth input electrode 173hB with respect to the eighth semiconductor island 154hB, and the eighth output electrode 175hB and the seventh output electrode 175g form a fifth electrode member 178.

Each of the emission signal line 170B, the eighth control electrode 124hB, the eighth semiconductor island 154hB and the eighth output electrode 175b includes a first portion 53B not neighboring a pixel electrode 191B and a second portion 54B neighboring the pixel electrode 191B. That is, the second portion 54B is disposed in the area between the first pixel B and the second pixel G. The second portion 54B is curved from the first portion 53B toward the second pixel G and extends therealong until curving back towards the first pixel B as they approach the next gate line 121.

A passivation layer 180 is formed on the data conductors 170B, 171B, 173c-hB and 175c-hB and the exposed portions of the semiconductors 154c-hB.

The passivation layer 180 has a plurality of contact holes 182, 185a, 185b and 185c respectively exposing the end portions 179 of the data lines 171B, the fourth output electrodes, the fifth input electrodes and the seventh output electrodes 175d, 173e and 175g, and the passivation layer 180 and the gate insulating layer 140 have a plurality of contact holes 181, 184a, 184b and 184c respectively exposing the end portions 129 of the scanning lines 121, the sixth control electrodes 124f, the pre-charge voltage lines 122 and the eighth control electrodes 124hB.

A plurality of pixel electrodes 191B, a plurality of connecting members 85a and 85b, and a plurality of contact assistants 81 and 82 are formed on the passivation layer 180.

The pixel electrode 191B is physically and electrically connected to the seventh and the eighth output electrodes 175g and 175hB through the contact hole 185c and is also physically and electrically connected to the seventh control electrode 124g through the contact hole 184c.

The connecting member 85a connects the fourth input electrode 173d and the sixth and the eighth control electrodes 124f and 124hB through the contact holes 184a and 185a. The connecting member 85b connects the fifth input electrode 173e and the pre-charge voltage line 122 through the contact holes 184b and 185b.

The contact assistants 81 and 82 are connected to the end portion 129 of the scanning line 121 and the end portion 179 of the data line 171B through the contact holes 181 and 182, respectively. The contact assistants 81 and 82 supplement the adhesive property of the end portions 129 and 179 of the scanning lines 121 and the data lines 171B to exterior devices, and protect them from wear, corrosion, etc.

A partition 361 is formed on the passivation layer 180. Organic light emitting members 370 are disposed in the openings 365 on the pixel electrodes 191B defined by the partition 361. A common electrode 270 is formed on the organic light emitting member 370.

According to the present exemplary embodiment of an OLED display, the third control electrode 124c, the third input electrode 173c and the third output electrode 175c along with the third semiconductor island 154c form the first switching TFT Qs1; the fourth control electrode 124d, the fourth input electrode 173d and the fourth output electrode 175d along with the fourth semiconductor island 154d form the second switching TFT Qs2; the fifth control electrode 124e, the fifth input electrode 173e, and the fifth output electrode 175e, along with the fifth semiconductor island 154e, form the third switching TFT Qs3.

Here, a channel of the first switching TFT Qs1 is formed in the third semiconductor island 154c disposed between the third input electrode 173c and the third output electrode 175c, and a channel of the fourth switching TFT Qs2 is formed in the fourth semiconductor island 154d disposed between the fourth input electrode 173d and the fourth output electrode 175d, and a channel of the third switching TFT Qs3 is formed in the fifth semiconductor island 154e disposed between the fifth input electrode 173e and the fifth output electrode 175e.

The sixth control electrode 124f, the sixth input electrode 173f, and the sixth output electrode 175f, along with the sixth semiconductor island 154c, form a reference TFT Qr having a channel formed in the sixth semiconductor island 154c disposed between the sixth input electrode 173f and the sixth output electrode 175f.

The seventh control electrode 124g, the seventh input electrode 173g, and the seventh output electrode 175g, along with the seventh semiconductor island 154g, form a cutoff TFT Qt having a channel in the seventh semiconductor island 154g disposed between the seventh input electrode 173g and the seventh output electrode 175g.

The eighth control electrode 124hB, the eighth input electrode 173hB, and the eighth output electrode 175hB, along with the eighth semiconductor island 154hB, form a driving TFT Qd having a channel in the eighth semiconductor island 154hB disposed between the eighth input electrode 173hB and the eighth output electrode 175hB.

The eighth output electrode 175hB and the eighth control electrode 124hB overlap each other to form 124hB a capacitor Cst.

Now, the structure of the second pixel G will be described in more detail.

In the second pixel G, unlike the first pixel B, an eighth control electrode 124hG, an eighth semiconductor island 154hG, and an eighth output electrode 175hG don't neighbor a pixel electrode 191G. That is, the eighth control electrode 124hG, the eighth semiconductor island 154hG, and the eighth output electrode 175hG are not disposed in the area between the second pixel G and the third pixel R, and a driving transistor is not formed there. Consequently, the space between the second and the third pixels G and R can be decreased compared to the space between the first and the second pixels B and G. As described above, the emission signal line 170B, the eighth control electrode 124hB, the eighth semiconductor island 154hB, and the eighth output electrode 175hB of the first pixel B are curved toward the second pixel G, and the space between the second and the third pixels G and R can be used for increasing the area of either or both of the pixel electrodes 191B and 191G of the first and the second pixels B and G. Therefore, the area of the pixel electrodes 191G is widened and therefore the aperture ratio is increased.

A capacitance assistant 85c is formed in the place where a portion of the eighth control electrode 124hG and the eighth output electrode 175hG overlap each other. The capacitance assistant 85c is connected to the eighth control electrode 124hG through a contact hole 185d. Since the overlapping area of the eighth control electrode 124hG and the eighth output electrode 175hG in the second pixel G is small compared to a similar overlapping area in the first pixel B, the capacitance of the capacitor Cst is decreased proportional to the decrease in the area of the overlap. In order to minimize the effect of such a decrease, the capacitance of the capacitor Cst can be increased by forming a capacitance assistant 85c.

Now, the structure of the third pixel R will be described in more detail.

In the third pixel R, similar to the first pixel B, each of an eighth control electrode 124hR, an eighth semiconductor island 154hR, and an eighth output electrode 175hR includes a first portion 53R not neighboring the pixel electrode 191R and a second portion 54R neighboring a pixel electrode 191R. However, the length of the first portion 53R of the third pixel R is shorter than the first portion 53B of the first pixel B. A portion of the pixel electrode 191R is extended into the additional space which is created by the shortened second portion 54R. Consequently, the area of the pixel electrode 191R is increased, thereby increasing the aperture ratio thereof.

Similar to the pixel G described above, a capacitance assistant 85c is formed in the place where a portion of the eighth control electrode 124hR and the eighth output electrode 175hR overlap each other. The capacitance assistant 85c is connected to the eighth control electrode 124hR through a contact hole 185d. Since the overlapping area of the eighth control electrode 124hR and the eighth output electrode 175hR in the third pixel R is small compared to a similar overlapping area in the first pixel B, the capacitance of the capacitor Cst is decreased proportional to the decrease in the area of the overlap. In order to minimize the effect of such a decrease, the capacitance of the capacitor Cst can be increased by forming a capacitance assistant 85c.

As described above, when blue pixels B, green pixels G, and red pixels R are disposed to neighbor each other, a channel width of the driving transistor of the blue pixel B having the lowest light emitting efficiency is made to be the widest, and the channel width of the driving transistor becomes narrower from the red pixel R to the green pixel G. The additional area created by reducing the area of the eighth control electrode, the eighth semiconductor island, and the eighth output electrode may be used to increase the area of the pixel electrode. Therefore, an aperture ratio of a display device can be increased while properly adjusting channel widths of three pixels B, G and R having different light emitting efficiencies from each other.

According to an exemplary embodiment of the present invention, the aperture ratio can be increased while ensuring current driving characteristics of an OLED display.

While this invention has been described in connection with what is presently considered to be practical exemplary embodiments, it is to be understood that the present invention is not limited to the disclosed exemplary embodiments, but, on the contrary, is intended to cover various modifications and equivalent arrangements included within the spirit and scope of the appended claims.

What is claimed is:

1. A display device, comprising:
    first, second and third pixel electrodes, each of the first, the second and the third pixel electrodes comprising a first edge and a second edge which is longer than the first edge;
    a first electrode connected to the first pixel electrode;
    a second electrode connected to the second pixel electrode;
    a third electrode connected to the third pixel electrode;
    a fourth electrode opposing the first electrode with respect to a fifth electrode;
    a sixth electrode opposing the second electrode with respect to a seventh electrode; and
    an eighth electrode opposing the third electrode with respect to a ninth electrode,
    wherein each of the first, fourth and fifth electrodes comprise a first portion disposed between the first pixel electrode and the second pixel electrode, a second portion disposed outside of a space between the first pixel electrode and the second pixel electrode and a third portion, which is linear, connecting the first portion and the second portion, the third portion not parallel to either the first or second portions, and
    the second, sixth and seventh electrodes are disposed outside of a space between the second pixel electrode and the third pixel electrode.

2. The display device of claim 1, wherein the second portions of the first, fourth and fifth electrodes extend substantially parallel to the first edge of the first pixel electrode.

3. The display device of claim 1, wherein lengths of the third, eighth and ninth electrodes are shorter than lengths of the first, fourth and fifth electrodes, respectively.

4. The display device of claim 1, wherein the third, eighth and the ninth electrode each comprise portions extending substantially parallel to the second edge of the third pixel electrode.

5. The display device of claim 1, wherein at least one of the first portion and the second portion of each of the first, fourth and fifth electrodes further comprises a curved section.

6. The display device of claim 5, wherein an angle formed by the first portion and the second portion of the first, fourth and fifth electrodes is substantially 90 degrees.

7. The display device of claim 5, wherein the curved section of each of the first, fourth and fifth electrodes are substantially symmetrical to one another.

8. The display device of claim 1, further comprising:
    a driving voltage line disposed between the first pixel electrode and the second pixel electrode, the driving voltage line applying a driving voltage to the fourth electrode; and
    a data line disposed between the first pixel electrode and the second pixel electrode,
    wherein portions of the driving voltage line and the data line are curved toward the second pixel electrode.

9. The display device of claim 8, further comprising a scanning line substantially perpendicular to the driving voltage line and the data line.

10. The display device of claim 8, wherein the first pixel electrode extends into an area corresponding to the curved portions of the driving voltage line and the data line.

11. The display device of claim 1, further comprising:
    an emission signal line disposed between the first pixel electrode and the second pixel electrode, the emission signal line alternately applying a driving voltage and a reference voltage to the second electrode; and
    a data line disposed between the first pixel electrode and the second pixel electrode,
    wherein portions of the emission signal line and the data line are curved toward the second pixel electrode.

12. The display device of claim 11, further comprising:
    a scanning line disposed substantially perpendicular to the emission signal line; and
    a pre-charge voltage line disposed substantially parallel to the scanning line.

13. The display device of claim 11, further comprising:
    a scanning line disposed substantially perpendicular to the data line; and
    a pre-charge voltage line disposed substantially perpendicular to the scanning line.

14. The display device of claim 11, wherein a first pixel comprising the first pixel electrode emits light having a blue color when on, a second pixel comprising the second pixel electrode emits light having a green color when on and a third pixel comprising the third pixel electrode emits light having a red color when on.

15. The display device of claim 1, wherein a pixel comprising the second or third pixel electrode emits light having a green or red color when on.

16. A display device, comprising:
    first, second and third pixel electrodes, each of the first, the second and the third pixel electrodes comprising a first edge and a second edge which is longer than the first edge;
    a first electrode connected to the first pixel electrode;
    a second electrode connected to the second pixel electrode;
    a third electrode connected to the third pixel electrode;
    a fourth electrode opposing the first electrode with respect to a fifth electrode;
    a sixth electrode opposing the second electrode with respect to a seventh electrode; and
    an eighth electrode opposing the third electrode with respect to a ninth electrode,
    wherein each of the first, fourth and fifth electrodes comprise a first portion disposed between the first pixel electrode and the second pixel electrode and a second portion disposed outside of a space between the first pixel electrode and the second pixel electrode,
    the second electrode is disposed entirely outside of a space between the second pixel electrode and the third pixel electrode,
    the sixth and seventh electrodes are disposed outside of a space between the second pixel electrode and the third pixel electrode,
    the first portion and the second portion of each of the first, fourth and fifth electrodes are connected to each other by a bent section, and
    a pixel comprising the first pixel electrode emits light having a blue color when on.

17. A display device, comprising:
    first, second and third pixel electrodes, each of the first, the second and the third pixel electrodes comprising a first edge and a second edge which is longer than the first edge;
    a first electrode connected to the first pixel electrode;

a second electrode connected to the second pixel electrode;
a third electrode connected to the third pixel electrode;
a fourth electrode opposing the first electrode with respect to a fifth electrode;
a sixth electrode opposing the second electrode with respect to a seventh electrode; and
an eighth electrode opposing the third electrode with respect to a ninth electrode,
wherein each of the first, fourth and fifth electrodes comprise a first portion disposed between the first pixel electrode and the second pixel electrode, a second portion disposed outside of a space between the first pixel electrode and the second pixel electrode and a third portion, which is curved, connecting the first portion and the second portion, the third portion not comprising a portion parallel to either the first or second portions,
the second, sixth and seventh electrodes are disposed outside of a space between the second pixel electrode and the third pixel electrode, and
a pixel comprising the first pixel electrode emits light having a blue color when on.

* * * * *